US012174239B2

(12) United States Patent
Tran et al.

(10) Patent No.: US 12,174,239 B2
(45) Date of Patent: Dec. 24, 2024

(54) THERMAL TESTING SYSTEM HAVING SAFETY FEATURE(S) AND MULTIPLE INDEPENDENTLY CONTROLLED THERMOELECTRIC COOLERS

(71) Applicant: Microsoft Technology Licensing, LLC, Redmond, WA (US)

(72) Inventors: Quang Thanh Tran, San Jose, CA (US); Judith Cutaran Aarts, San Jose, CA (US); John S. Hickman, Reno, NV (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 394 days.

(21) Appl. No.: 17/520,567

(22) Filed: Nov. 5, 2021

(65) Prior Publication Data

US 2023/0143199 A1   May 11, 2023

(51) Int. Cl.
G01R 31/26 (2020.01)
G01K 3/00 (2006.01)
G01R 19/165 (2006.01)

(52) U.S. Cl.
CPC ......... *G01R 31/2642* (2013.01); *G01K 3/005* (2013.01); *G01R 19/16571* (2013.01)

(58) Field of Classification Search
CPC .......... G01R 31/2642; G01R 19/16571; G01R 31/2862; G01R 31/2874; G01K 3/005; F25B 21/04; F25B 2321/0212; F25B 2321/023; F25B 2700/2104
USPC .................................... 324/750.05
See application file for complete search history.

(56) References Cited

U.S. PATENT DOCUMENTS

| | | | |
|---|---|---|---|
| 4,867,574 A | 9/1989 | Jenkofsky | |
| 6,094,918 A * | 8/2000 | Burbidge | G05D 23/24 62/3.7 |
| 7,079,721 B2 | 7/2006 | Kish et al. | |
| 7,648,835 B2 | 1/2010 | Breidford et al. | |
| 8,307,839 B2 | 11/2012 | Peukert et al. | |
| 8,766,656 B2 | 7/2014 | Malik et al. | |
| 8,779,333 B2 | 7/2014 | Collins et al. | |

(Continued)

FOREIGN PATENT DOCUMENTS

IN   01198MU2015   10/2016

OTHER PUBLICATIONS

"Power Supply Requirements", Retrieved from: https://web.archive.org/web/20190122231733/https://thermal.ferrotec.com/technology/thermoelectric-reference-guide/thermalref07/, Jan. 22, 2019, 4 Pages.

(Continued)

*Primary Examiner* — Thang X Le
*Assistant Examiner* — Haidong Zhang
(74) *Attorney, Agent, or Firm* — Wade IP Law PLLC

(57) ABSTRACT

Techniques are described herein that are capable of using variable voltage sources to control respective thermoelectric coolers independently in a thermal testing environment. The variable voltage sources create temperature differentials between first and second opposing surfaces of the thermoelectric coolers by applying input voltages to the respective thermoelectric coolers. Heat is transferred, by first heat exchanger(s), between a fluid and respective subset(s) of the thermoelectric coolers Heat is transferred, by second heat exchanger(s), between semiconductor device(s) and the subset(s) of the thermoelectric coolers.

20 Claims, 10 Drawing Sheets

(56) References Cited

U.S. PATENT DOCUMENTS

| | | | |
|---|---|---|---|
| 10,036,579 B2 | 7/2018 | Ludwig | |
| 11,416,048 B2* | 8/2022 | Spica | G06F 1/20 |
| 2009/0272125 A1* | 11/2009 | Chan | H01L 23/38 |
| | | | 62/3.7 |
| 2011/0132000 A1 | 6/2011 | Deane et al. | |
| 2013/0285686 A1* | 10/2013 | Malik | G01R 31/2875 |
| | | | 324/750.05 |
| 2017/0172788 A1* | 6/2017 | Calderon | A61F 7/02 |
| 2020/0194650 A1* | 6/2020 | Scobee | G01N 25/18 |
| 2020/0363104 A1 | 11/2020 | Macdonald et al. | |
| 2021/0123641 A1 | 4/2021 | Monazami et al. | |
| 2021/0181819 A1 | 6/2021 | Scobee et al. | |

OTHER PUBLICATIONS

"Thermoelectric Coolers for Reagent Storage", Retrieved from: https://web.archive.org/web/20210303201735/https://lairdthermal.com/thermal-technical-library/application-notes/Thermoelectric-coolers-for-reagent-storage, Mar. 3, 2021, 5 Pages.

"International Search Report and Written Opinion Issued in PCT Application No. PCT/US22/040826", Mailed Date: Dec. 8, 2022, 10 Pages.

Kwan, et al., "Complete Implementation of the Combined TEG-TEC Temperature Control and Energy Harvesting System", In Journal of Control Engineering Practice, vol. 95, Feb. 1, 2020, 11 Pages.

* cited by examiner

THERMAL TESTING SYSTEM HAVING SAFETY FEATURE(S) AND MULTIPLE INDEPENDENTLY CONTROLLED THERMOELECTRIC COOLERS

BACKGROUND

Thermal testing systems typically include a thermoelectric cooler and a thermal controller that are configured to control a temperature of a device under test. A thermoelectric cooler is a device (e.g., solid-state active heat pump) that is capable of transferring heat between its surfaces based on electrical energy that is applied to the thermoelectric cooler. For instance, the thermoelectric cooler may be configured to transfer heat in a first direction (e.g., from a first surface to a second surface) based on receipt of a positive input voltage. The thermoelectric cooler may be configured to transfer heat in a second direction, which is opposite the first direction, (e.g., from the second surface to the first surface) based on receipt of a negative input voltage.

A thermal controller is a device that generates an input voltage to control a thermoelectric cooler. In conventional thermal testing systems, the thermal controller generates a pre-defined fixed voltage, meaning that a heat differential between surfaces of the thermoelectric cooler is fixed. The fixed heat differential may be less than or greater than a desired heat differential. For instance, the fixed heat differential may cause the device under test to become too hot or too cold, which may negatively affect performance or reliability of the device or other components in the thermal testing system. The pre-defined fixed voltage of a conventional thermal controller may limit a temperature range over which the device under test may be thermally tested.

SUMMARY

Various approaches are described herein for, among other things, using variable voltage sources to control respective thermoelectric coolers independently in a thermal testing environment. For instance, a first variable voltage source may select a first input voltage from multiple voltages and apply the first input voltage to a first thermoelectric cooler; a second variable voltage source may select a second input voltage, which is different from the first input voltage, from multiple voltages and apply the second input voltage to a second thermoelectric cooler, and so on. By applying the input voltages to the respective thermoelectric coolers, temperature(s) of semiconductor device(s) may be set. An amplitude of an input voltage being relatively high may result in a relatively greater temperature differential across a thermoelectric cooler that is controlled by the input voltage. The amplitude of the input voltage being relatively low may result in a relatively lesser temperature differential across the thermoelectric cooler that is controlled by the input voltage. A single thermoelectric cooler may be used to set the temperature of a semiconductor device, or multiple thermoelectric coolers may be used to collaboratively set the temperature of the semiconductor device.

In a first example approach, a thermal testing system includes thermoelectric coolers, a thermal controller, first heat exchanger(s), and second heat exchanger(s). Each of the thermoelectric coolers has first and second opposing surfaces. Each of the thermoelectric coolers is configured to have a temperature differential between the first and second opposing surfaces of the respective thermoelectric cooler, which is caused by a Peltier effect, based on a respective input voltage. Each of multiple subsets of the thermoelectric coolers is positioned between a respective first heat exchanger and a respective second heat exchanger. Each subset includes at least one of the thermoelectric coolers. The thermal controller includes a multiple variable voltage sources that are configured to control the respective thermoelectric coolers independently. Each variable voltage source is configured to generate a respective input voltage that corresponds to a respective target temperature differential such that the respective input voltage causes a respective thermoelectric cooler to have the respective target temperature differential between the first and second opposing surfaces of the respective thermoelectric cooler. Each first heat exchanger is configured to transfer heat between a respective subset of the thermoelectric coolers and a fluid. Each second heat exchanger is configured to transfer heat between a respective semiconductor device and a respective subset of the thermoelectric coolers. Each of the variable voltage sources is configured to discontinue providing the respective input voltage to the respective thermoelectric cooler based at least in part on a determination that a fluid pump from which the fluid is received by the first heat exchanger(s) encounters a technical issue.

In a second example approach, a thermal testing system includes thermoelectric coolers, a thermal controller, first heat exchanger(s), second heat exchanger(s), and a processing system. Each of the thermoelectric coolers has first and second opposing surfaces. Each of the thermoelectric coolers is configured to have a temperature differential between the first and second opposing surfaces of the respective thermoelectric cooler, which is caused by a Peltier effect, based on a respective input voltage. Each of multiple subsets of the thermoelectric coolers is positioned between a respective first heat exchanger and a respective second heat exchanger. Each subset includes at least one of the thermoelectric coolers. The thermal controller includes a multiple variable voltage sources that are configured to control the respective thermoelectric coolers independently. Each variable voltage source is configured to generate a respective input voltage that corresponds to a respective target temperature differential such that the respective input voltage causes a respective thermoelectric cooler to have the respective target temperature differential between the first and second opposing surfaces of the respective thermoelectric cooler. Each first heat exchanger is configured to transfer heat between a respective subset of the thermoelectric coolers and a fluid. Each second heat exchanger is configured to transfer heat between a respective semiconductor device and a respective subset of the thermoelectric coolers. The processing system is configured to identify a target temperature of a designated semiconductor device by reviewing a temperature indicator that indicates the target temperature, which is manually set by a user of the thermal testing system or which is programmatically set by software. The processing system is further configured to determine whether a human or programmatic error occurs with regard to setting of the target temperature based at least in part on whether an absolute value of the target temperature is greater than or equal to a first temperature threshold. The processing system is further configured to cause each of the variable voltage sources to not provide the respective input voltage to the respective thermoelectric cooler based at least in part on a determination that the human or programmatic error occurs with regard to the setting of the target temperature as a result of the absolute value of the target temperature being greater than or equal to the first temperature threshold.

In a third example approach, a thermal testing system includes thermoelectric coolers, a thermal controller, first heat exchanger(s), second heat exchanger(s), and a current sensor. Each of the thermoelectric coolers has first and second opposing surfaces. Each of the thermoelectric coolers is configured to have a temperature differential between the first and second opposing surfaces of the respective thermoelectric cooler, which is caused by a Peltier effect, based on a respective input voltage. Each of multiple subsets of the thermoelectric coolers is positioned between a respective first heat exchanger and a respective second heat exchanger. Each subset includes at least one of the thermoelectric coolers. The thermal controller includes multiple variable voltage sources that are configured to control the respective thermoelectric coolers independently. Each variable voltage source is configured to generate a respective input voltage that corresponds to a respective target temperature differential such that the respective input voltage causes a respective thermoelectric cooler to have the respective target temperature differential between the first and second opposing surfaces of the respective thermoelectric cooler. Each first heat exchanger is configured to transfer heat between a respective subset of the thermoelectric coolers and a fluid. Each second heat exchanger is configured to transfer heat between a respective semiconductor device and a respective subset of the thermoelectric coolers. The current sensor is configured to detect currents that are provided to the respective thermoelectric coolers. Each of the variable voltage sources is configured to discontinue providing the respective input voltage to the respective thermoelectric cooler based at least in part on a magnitude of the current that is provided to the respective thermoelectric cooler, as detected by the current sensor, being less than or equal to a current threshold This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Moreover, it is noted that the invention is not limited to the specific embodiments described in the Detailed Description and/or other sections of this document. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate embodiments of the present invention and, together with the description, further serve to explain the principles involved and to enable a person skilled in the relevant art(s) to make and use the disclosed technologies.

Figure 1:
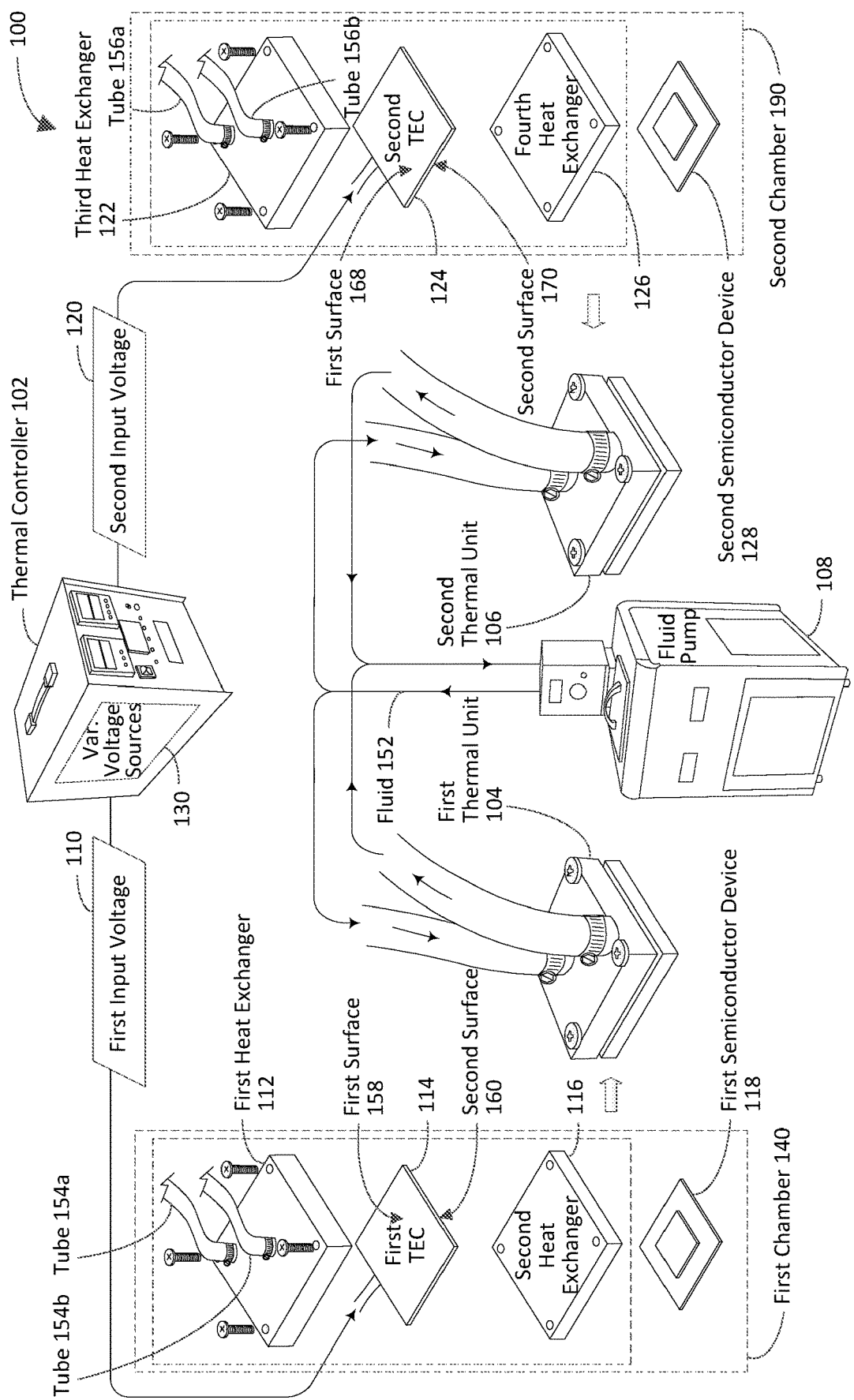
FIGS. 1-4 are block diagrams of example thermal testing systems in accordance with embodiments.

The features and advantages of the disclosed technologies will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

I. Introduction

The following detailed description refers to the accompanying drawings that illustrate exemplary embodiments of the present invention. However, the scope of the present invention is not limited to these embodiments, but is instead defined by the appended claims. Thus, embodiments beyond those shown in the accompanying drawings, such as modified versions of the illustrated embodiments, may nevertheless be encompassed by the present invention.

References in the specification to "one embodiment," "an embodiment," "an example embodiment," or the like, indicate that the embodiment described may include a particular feature, structure, or characteristic, but every embodiment may not necessarily include the particular feature, structure, or characteristic. Moreover, such phrases are not necessarily referring to the same embodiment. Furthermore, when a particular feature, structure, or characteristic is described in connection with an embodiment, it is submitted that it is within the knowledge of one skilled in the relevant art(s) to implement such feature, structure, or characteristic in connection with other embodiments whether or not explicitly described.

Descriptors such as "first", "second", "third", etc. are used to reference some elements discussed herein. Such descriptors are used to facilitate the discussion of the example embodiments and do not indicate a required order of the referenced elements, unless an affirmative statement is made herein that such an order is required.

II. Example Embodiments

Example embodiments described herein are capable of using variable voltage sources to control respective thermoelectric coolers independently in a thermal testing environment. For instance, a first variable voltage source may select a first input voltage from multiple voltages and apply the first input voltage to a first thermoelectric cooler; a second variable voltage source may select a second input voltage, which is different from the first input voltage, from multiple voltages and apply the second input voltage to a second thermoelectric cooler, and so on. By applying the input voltages to the respective thermoelectric coolers, temperature(s) of semiconductor device(s) may be set. An amplitude of an input voltage being relatively high may result in a relatively greater temperature differential across a thermoelectric cooler that is controlled by the input voltage. The amplitude of the input voltage being relatively low may result in a relatively lesser temperature differential across the thermoelectric cooler that is controlled by the input voltage. A single thermoelectric cooler may be used to set the temperature of a semiconductor device, or multiple thermoelectric coolers may be used to collaboratively set the temperature of the semiconductor device.

Example techniques described herein have a variety of benefits as compared to conventional techniques for setting temperature(s) of semiconductor device(s) in a thermal testing environment. For instance, the example techniques may be capable of controlling thermoelectric coolers independently using variable voltage sources. Each of the variable voltage sources may select an input voltage from multiple input voltages, and the input voltages may be applied to the respective thermoelectric coolers. By selecting different input voltages to control the thermoelectric coolers, the variable voltage sources may cause different temperature differentials to be generated across the respective thermoelectric coolers. By using variable voltage sources, the example techniques may be capable of setting temperature(s) of semiconductor device(s) and an amount of power thermal dissipation more accurately, precisely, and/or reliably than the conventional techniques.

The example techniques may increase efficiency of a thermal testing process. For instance, the example techniques may reduce a likelihood that semiconductor device(s) or thermoelectric cooler(s) will need to be replaced during thermal testing due to the semiconductor device(s) or the thermoelectric cooler(s) failing (e.g., being structurally damaged) as a result of the semiconductor device(s) or the thermoelectric cooler(s) being inadvertently heated beyond upper target temperature(s) or being inadvertently cooled below lower target temperature(s). It should be noted that reducing a likelihood of the semiconductor device(s) or the thermoelectric cooler(s) to be inadvertently heated beyond the upper target temperature(s) or to be inadvertently cooled below the lower target temperature(s) may increase performance, reliability, and/or life span of the semiconductor device(s), the thermoelectric cooler(s), or other components in the thermal testing system. Regardless, by reducing the likelihood that the semiconductor device(s) or the thermoelectric cooler(s) will need to be replaced, the example techniques may reduce a cost of thermally testing the semiconductor device(s). For instance, the cost associated with replacing the semiconductor device(s) or the thermoelectric cooler(s) due to the aforementioned circumstances may be avoided.

The example techniques may enable multiple semiconductor devices to be thermal tested simultaneously under different thermal conditions. For instance, input voltages applied to thermoelectric coolers associated with a first semiconductor device may be different from input voltages applied to thermoelectric coolers associated with a second semiconductor device such that a cumulative temperature differential across the thermoelectric coolers associated with the first semiconductor device and a cumulative temperature differential across the thermoelectric coolers associated with the second semiconductor device are different. By enabling multiple semiconductor devices to be thermal tested simultaneously under different thermal conditions, the additional time and cost associated with testing the semiconductor devices during different (e.g., consecutive) time periods may be avoided.

The example techniques may be capable of thermally testing semiconductor device(s) over a greater range of temperatures, at lower temperatures, and/or at higher temperatures than the conventional techniques. For instance, using a variable voltage source to establish a temperature differential across a thermoelectric cooler and/or using multiple thermoelectric coolers to set the temperature of a semiconductor device may enable a thermal testing system to increase the range of temperatures over which the semiconductor device may be tested, reduce a lower temperature at which the semiconductor device may be tested, and/or increase an upper temperature at which the semiconductor device may be tested.

A user experience of a person who oversees thermal testing of semiconductor devices may be increased, for example, by obviating a need for the person to replace semiconductor devices or thermoelectric coolers due to the semiconductor devices or the thermoelectric coolers failing as a result of being inadvertently heated beyond upper target temperature(s) or being inadvertently cooled below lower target temperature(s). The user experience of the person may be increased, for example, by obviating a need for the person to test the semiconductor devices during different time periods (e.g., in order to test the devices under different thermal conditions). By eliminating a need for the person to perform such operations, a cost of thermally testing the semiconductor devices may be reduced. For instance, time spent by a person to replace failed semiconductor devices or failed thermoelectric coolers or to test semiconductor devices at different time periods has an associated cost. By eliminating the need for these operations, the cost of thermally testing the semiconductor devices can be reduced by the labor cost associated with the person performing the operations.

FIG. 1 is a block diagram of an example thermal testing system 100 in accordance with an embodiment. Generally speaking, the thermal testing system 100 operates to set temperatures of respective first and second semiconductor devices 118 and 128 (e.g., for the purpose of testing operation of the semiconductor devices 118 and 128 at the respective temperatures). As shown in FIG. 1, the thermal testing system 100 includes a thermal controller 102, a first thermal unit 104, a second thermal unit 106, a fluid pump 108, a first semiconductor device 118, and a second semiconductor device 128. The first thermal unit 104 includes a first heat exchanger 112, a first thermoelectric cooler (TEC) 114, and a second heat exchanger 116. The first heat exchanger 112 is configured to transfer heat between a fluid 152 and the first TEC 114. For instance, the first heat exchanger 112 is configured such that a temperature of the first heat exchanger 112 changes to correspond to a temperature of a first surface 158 of the first TEC 114, which is proximate the first heat exchanger 112. If the temperature of the first surface 158 of the first TEC 114 is greater than a temperature of the fluid 152, the heat transfers from the first surface 158 of the first TEC 114 through the first heat exchanger 112 to the fluid 152. If the temperature of the first surface 158 of the first TEC 114 is less than the temperature of the fluid 152, the heat transfers from the fluid 152 through the first heat exchanger 112 to the first surface 158 of the first TEC 114.

The first TEC 114 has the first surface 158 and a second surface 160. The first and second surfaces 158 and 160 are on opposite sides of the first TEC 114. The first TEC 114 is configured to have a temperature differential between the first and second surfaces 158 and 160 that is based on a first input voltage 110. A greater amplitude of the first input signal 110 corresponds to a greater temperature differential between the first and second surfaces 158 and 160. A lesser amplitude of the first input signal 110 corresponds to a lesser temperature differential between the first and second surfaces 158 and 160. In one example, the first input voltage 110 being positive may correspond to the temperature of the first surface 158 being greater than the temperature of the second surface 160, and the first input voltage 110 being negative may correspond to the temperature of the first surface 158 being less than the temperature of the second surface 160. In another example, the first input voltage 110 being positive may correspond to the temperature of the first surface 158 being less than the temperature of the second surface 160, and the first input voltage 110 being negative may correspond to the temperature of the first surface 158 being greater than the temperature of the second surface 160.

The second heat exchanger 116 is configured to transfer heat between the first semiconductor device 118 and the first TEC 114. For instance, the second heat exchanger 116 is configured such that a temperature of the second heat exchanger 116 changes to correspond to the temperature of the second surface 160 of the first TEC 114, which is proximate the second heat exchanger 116. If the temperature of the second surface 160 of the first TEC 114 is greater than a temperature of the first semiconductor device 118, the heat transfers from the second surface 160 of the first TEC 114 through the second heat exchanger 116 to the first semiconductor device 118. If the temperature of the second surface 160 of the first TEC 114 is less than the temperature of the first semiconductor device 118, the heat transfers from the first semiconductor device 118 through the second heat exchanger 116 to the second surface 160 of the first TEC 114.

The first semiconductor device 118 may be controlled (e.g., by a processing system) to perform operations at any one or more temperatures, as set by the thermal testing system 100, in accordance with a thermal testing process to determine how the first semiconductor device 118 performs at those temperature(s). For instance, the performance of the first semiconductor device 118 may be analyzed (e.g., using the processing system) to determine whether the temperature(s) affect performance of the first semiconductor device 118 and to what extent the performance of the first semiconductor device 118 is affected by the temperature(s).

The second thermal unit 106 includes a third heat exchanger 122, a second TEC 124, and a fourth heat exchanger 126. The third heat exchanger 122 is configured to transfer heat between the fluid 152 and the second TEC 124. For instance, the third heat exchanger 122 is configured such that a temperature of the third heat exchanger 122 changes to correspond to a temperature of a first surface 168 of the second TEC 124, which is proximate the third heat exchanger 122. If the temperature of the first surface 168 of the second TEC 124 is greater than a temperature of the fluid 152, the heat transfers from the first surface 168 of the second TEC 124 through the third heat exchanger 122 to the fluid 152. If the temperature of the first surface 168 of the second TEC 124 is less than the temperature of the fluid 152, the heat transfers from the fluid 152 through the third heat exchanger 122 to the first surface 168 of the second TEC 124.

The second TEC 124 has the first surface 168 and a second surface 170. The first and second surfaces 168 and 170 are on opposite sides of the second TEC 124. The second TEC 124 is configured to have a temperature differential between the first and second surfaces 168 and 170 that is based on a second input voltage 120. A greater amplitude of the second input voltage 120 corresponds to a greater temperature differential between the first and second surfaces 168 and 170. A lesser amplitude of the second input voltage 120 corresponds to a lesser temperature differential between the first and second surfaces 168 and 170. In one example, the second input voltage 120 being positive may correspond to the temperature of the first surface 168 being greater than the temperature of the second surface 170, and the second input voltage 120 being negative may correspond to the temperature of the first surface 168 being less than the temperature of the second surface 170. In another example, the second input voltage 120 being positive may correspond to the temperature of the first surface 168 being less than the temperature of the second surface 170, and the second input voltage 120 being negative may correspond to the temperature of the first surface 168 being greater than the temperature of the second surface 170.

The fourth heat exchanger 126 is configured to transfer heat between the second semiconductor device 128 and the second TEC 124. For instance, the fourth heat exchanger 126 is configured such that a temperature of the fourth heat exchanger 126 changes to correspond to the temperature of the second surface 170 of the second TEC 124, which is proximate the fourth heat exchanger 126. If the temperature of the second surface 170 of the second TEC 124 is greater than a temperature of the second semiconductor device 128, the heat transfers from the second surface 170 of the second TEC 124 through the fourth heat exchanger 126 to the second semiconductor device 128. If the temperature of the second surface 170 of the second TEC 124 is less than the temperature of the second semiconductor device 128, the heat transfers from the second semiconductor device 128 through the fourth heat exchanger 126 to the second surface 170 of the second TEC 124.

The second semiconductor device 128 may be controlled (e.g., by a processing system) to perform operations at any one or more temperatures, as set by the thermal testing system 100, in accordance with a thermal testing process to determine how the second semiconductor device 128 performs at those temperature(s). For instance, the performance of the second semiconductor device 128 may be analyzed (e.g., using the processing system) to determine whether the temperature(s) affect performance of the second semiconductor device 128 and to what extent the performance of the second semiconductor device 128 is affected by the temperature(s).

Each of the first semiconductor device 118 and 128 may be any suitable type of semiconductor device, including but not limited to a semiconductor chip, a semiconductor sensor, and a laser. A size of the first semiconductor device 118 and a size of the second semiconductor device 128 may be same or different.

The first thermal unit 104 and the first semiconductor device 118 are shown to be included in a first chamber 140, and the second thermal unit 106 and the second semiconductor device 128 are shown to be included in a second chamber 190, for non-liming, illustrative purposes. It will be recognized that the first thermal unit 104 and the first semiconductor device 118 may not be included in the first chamber 140. It will be further recognized that the second thermal unit 106 and the second semiconductor device 128 may not be included in the second chamber 190.

The thermal controller 102 includes multiple variable voltage sources 130, which are configured to control the first and second TECs 114 and 124 independently. For instance, the variable voltage sources 130 include a first variable voltage source that is configured to generate the first input voltage 110 to be applied to the first TEC 114. The first input voltage 110 is configured to cause the first TEC 114 to have a first target temperature differential, which corresponds to the first input voltage 110, between the first and second surfaces 158 and 160 of the first TEC 114. The variable voltage sources 130 further include a second variable voltage source that is configured to generate the second input voltage 120 to be applied to the second TEC 124. The second input voltage 110 is configured to cause the second TEC 124 to have a second target temperature differential, which corresponds to the second input voltage 120, between the first and second surfaces 168 and 170 of the second TEC 124.

The fluid pump 108 is configured to pump the fluid 152 to the first and third heat exchangers 112 and 122. For instance, the fluid pump 108 may pump the fluid 152 through tube 154a to the first heat exchanger 112. The fluid 152 may flow through the first heat exchanger 112 to enable heat to be transferred between the fluid 152 and the first heat exchanger 112, and the fluid 152 may then return to the fluid pump 108 through tube 154b. The fluid pump 108 may pump the fluid 152 through tube 156a to the third heat exchanger 122. The fluid 152 may flow through the third heat exchanger 122 to enable heat to be transferred between the fluid 152 and the third heat exchanger 122, and the fluid 152 may then return to the fluid pump 108 through tube 156b. The fluid pump 108 may control the temperature of the fluid 152 that is to be provided to the first and third heat exchangers 112 and 122 to be equal to a target temperature or to be within a target range of temperatures. The fluid pump 108 may change the temperature of the fluid 152 that is received from the first and third heat exchangers 112 and 122 to be equal to the target temperature or to be within the target range of temperatures. Accordingly, the fluid pump 108 may cool or heat the fluid 152 to achieve a desired temperature. The fluid 152 may be water, for example.

The thermal testing system 100 is shown in FIG. 1 to include a single fluid pump for illustrative purposes and is not intended to be limiting. It will be recognized that the thermal testing system 100 may include any suitable number of fluid pumps. For instance, in an example embodiment, the thermal testing system 100 includes two fluid pumps. In accordance with this embodiment, a first fluid pump is configured to pump a first fluid to the first heat exchanger 112, and a second fluid pump is configured to pump a second fluid to the third heat exchanger 122. The first fluid pump may be further configured to set a temperature of the first fluid. The second fluid pump may be further configured to set a temperature of the second fluid. A composition of the first fluid and a composition of the second fluid may be same or different.

It will be recognized that the thermal testing system 100 may not include one or more of the components shown in FIG. 1. Furthermore, the thermal testing system 100 may include components in addition to or in lieu of the any one or more of the components shown in FIG. 1. For instance, the thermal testing system 100 is shown to include two thermal units 104 and 106 for illustrative purposes and is not intended to be limiting. It will be recognized that the thermal testing system 100 may include any suitable number (e.g., 1, 2, 3, or 4) of thermal units.

Figure 2:
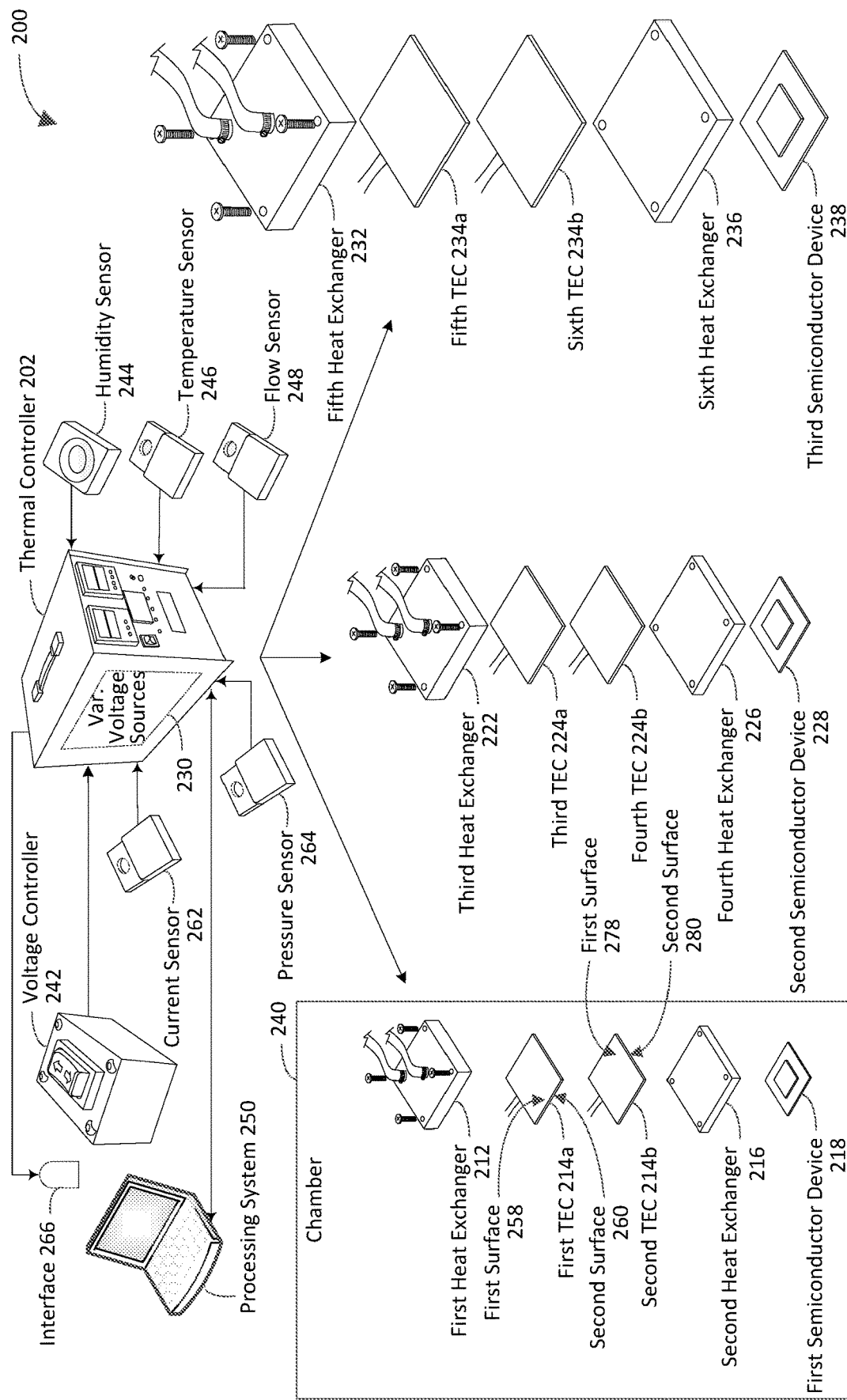

FIG. 2 is a block diagram of another example thermal testing system 200, which includes three thermal units for non-limiting, illustrative purposes, in accordance with an embodiment. Generally speaking, the thermal testing system 200 operates to set temperatures of respective first, second, and third semiconductor devices 218, 228, and 238 (e.g., for the purpose of testing operation of the semiconductor devices 218, 228, and 238 at the respective temperatures). As shown in FIG. 2, the thermal testing system 200 includes a thermal controller 202. The thermal controller 202 includes multiple variable voltage sources 230, which are configured to control a first TEC 214a, a second TEC 214b, a third TEC 224a, a fourth TEC 224b, a fifth TEC 234a, and a sixth TEC 234b independently. For example, the variable voltage sources 230 may include a first variable voltage source that controls the first TEC 214a, a second variable voltage source that controls the second TEC 214b, and so on. In accordance with this example, the first variable voltage source may generate a first input voltage that causes a first target temperature differential to be created across the first TEC 214a; the second variable voltage source may generate a second input voltage that causes a second target temperature differential to be created across the second TEC 214b, and so on.

The thermal testing system 200 further includes a first heat exchanger 212, a first TEC 214a, a second TEC 214b, a second heat exchanger 216, and the first semiconductor device 218. The first heat exchanger 212 is configured to transfer heat between a fluid and a combination of the first and second TECs 214a-214b. For instance, the first heat exchanger 212 is configured such that a temperature of the first heat exchanger 212 changes to correspond to a temperature of a first surface 258 of the first TEC 214a, which is proximate the first heat exchanger 212. If the temperature of the first surface 258 of the first TEC 214a is greater than a temperature of the fluid, the heat transfers from the first surface 258 of the first TEC 214a through the first heat exchanger 212 to the fluid. If the temperature of the first surface 258 of the first TEC 214a is less than the temperature of the fluid, the heat transfers from the fluid through the first heat exchanger 212 to the first surface 258 of the first TEC 214a.

The first TEC 214a has the first surface 258 and a second surface 260. The first and second surfaces 258 and 260 are on opposite sides of the first TEC 214a. The first TEC 214a is configured to have a temperature differential between the first and second surfaces 258 and 260 that is based on the first input voltage from the first variable voltage source, which is included among the variable voltage sources 230.

The second TEC 214b has a first surface 278 and a second surface 280. The first and second surfaces 278 and 280 are on opposite sides of the second TEC 214b. The second TEC 214b is configured to have a temperature differential between the first and second surfaces 278 and 280 that is based on the second input voltage from the second variable voltage source, which is included among the variable voltage sources 230. The first and second TECs 214a-214b are positioned consecutively between the first and second heat exchangers 212 and 216 such that the first surface 278 of the second TEC 214b is positioned proximate the second surface 260 of the first TEC 214a. For instance, the first surface 278 of the second TEC 214b may be in physical contact with the second surface 260 of the first TEC 214a. Accordingly, a temperature of the first surface 278 of the second TEC 214b and a temperature of the second surface 260 of the first TEC 214a are same.

The second heat exchanger 216 is configured to transfer heat between the first semiconductor device 218 and a combination of the first and second TECs 214a-214b. For instance, the second heat exchanger 216 is configured such that a temperature of the second heat exchanger 216 changes to correspond to the temperature of the second surface 280 of the second TEC 214b, which is proximate the second heat exchanger 216. If the temperature of the second surface 280 of the second TEC 214b is greater than a temperature of the first semiconductor device 218, the heat transfers from the second surface 280 of the second TEC 214b through the second heat exchanger 216 to the first semiconductor device 218. If the temperature of the second surface 280 of the second TEC 214b is less than the temperature of the first semiconductor device 218, the heat transfers from the first semiconductor device 218 through the second heat exchanger 216 to the second surface 280 of the second TEC 214b.

The first semiconductor device 218 may be controlled (e.g., by a processing system) to perform operations at any one or more temperatures, as set by the thermal testing system 200, in accordance with a thermal testing process to determine how the first semiconductor device 218 performs at those temperature(s).

The thermal testing system 200 further includes a third heat exchanger 222, a third TEC 224a, a fourth TEC 224b, a fourth heat exchanger 226, and the second semiconductor device 228. The third heat exchanger 222 is configured to transfer heat between the fluid and a combination of the third and fourth TECs 224a-224b similarly to a manner in which the first heat exchanger 212 transfers heat between the fluid and the combination of the first and second TECs 214a-214b.

The third and fourth TECs 224a-224b are positioned consecutively between the third and fourth heat exchangers 222 and 226. The third and fourth TECs 224a-224b are operable in manner similar to the first and second TECs 214a-214b. For instance, each of the third and fourth TECs 224a-224b has first and second opposing surfaces. Each of the third and fourth TECs 224a-224b is configured to have a temperature differential between its first and second opposing surfaces that is based on a respective input voltage from a respective variable voltage source, which is included among the variable voltage sources 230. For instance, the temperature differential between the first and second opposing surfaces of the third TEC 224a may be based on a third input voltage that is received from a third variable voltage source. The temperature differential between the first and second opposing surfaces of the fourth TEC 224b may be based on a fourth input voltage that is received from a fourth variable voltage source. The second surface of the third TEC 224a is proximate the first surface of the fourth TEC 224b, which causes a temperature of the second surface of the third TEC 224a and a temperature of the first surface of the fourth TEC 224b to be same.

The fourth heat exchanger 226 is configured to transfer heat between the second semiconductor device 228 and a combination of the third and fourth TECs 224a-224b similarly to a manner in which the second heat exchanger 216 transfers heat between the first semiconductor device 218 and the combination of the first and second TECs 214a-214b.

The second semiconductor device 228 may be controlled (e.g., by a processing system) to perform operations at any one or more temperatures, as set by the thermal testing system 200, in accordance with a thermal testing process to determine how the second semiconductor device 228 performs at those temperature(s).

The thermal testing system 200 further includes a fifth heat exchanger 232, a fifth TEC 234a, a sixth TEC 234b, a sixth heat exchanger 236, and the third semiconductor device 238. The fifth heat exchanger 232 is configured to transfer heat between the fluid and a combination of the fifth and sixth TECs 234a-234b similarly to a manner in which the first heat exchanger 212 transfers heat between the fluid and the combination of the first and second TECs 214a-214b.

The fifth and sixth TECs 234a-234b are positioned consecutively between the fifth and sixth heat exchangers 232 and 236. The fifth and sixth TECs 234a-234b are operable in manner similar to the first and second TECs 214a-214b. For instance, each of the fifth and sixth TECs 234a-234b has first and second opposing surfaces. Each of the fifth and sixth TECs 234a-234b is configured to have a temperature differential between its first and second opposing surfaces that is based on a respective input voltage from a respective variable voltage source, which is included among the variable voltage sources 230. For instance, the temperature differential between the first and second opposing surfaces of the fifth TEC 234a may be based on a fifth input voltage that is received from a fifth variable voltage source. The temperature differential between the first and second opposing surfaces of the sixth TEC 234b may be based on a sixth input voltage that is received from a sixth variable voltage source. The second surface of the fifth TEC 234a is proximate the first surface of the sixth TEC 234b, which causes a temperature of the second surface of the fifth TEC 234a and a temperature of the first surface of the sixth TEC 234b to be same.

The sixth heat exchanger 236 is configured to transfer heat between the third semiconductor device 238 and a combination of the fifth and sixth TECs 234a-234b similarly to a manner in which the second heat exchanger 216 transfers heat between the first semiconductor device 218 and the combination of the first and second TECs 214a-214b.

The third semiconductor device 238 may be controlled (e.g., by a processing system) to perform operations at any one or more temperatures, as set by the thermal testing system 200, in accordance with a thermal testing process to determine how the third semiconductor device 238 performs at those temperature(s).

The thermal testing system 200 further includes a voltage controller 242. The voltage controller 242 is a controller or a voltage source that is external to the thermal controller 202. The voltage controller 242 may be a variable voltage source (e.g., capable of generating any of a variety of voltages), a fixed voltage source (e.g., capable of generating a single, fixed voltage), or a controller (e.g., capable of changing input voltages provided by the variable voltage sources 230). The voltage controller 242 may be used in combination with or in lieu of any one or more of the variable voltage sources 230 to provide input voltage(s) to any one or more of the first TEC 214a, the second TEC 214b, the third TEC 224a, the fourth TEC 224b, the fifth TEC 234a, or the sixth TEC 234b.

The thermal testing system 200 further includes a humidity sensor 244. The humidity sensor 244 is configured to detect a relative humidity in an environment of any one or more of the first semiconductor device 218, the second semiconductor device 228, and/or the third semiconductor device 238. The humidity sensor 244 is further configured to generate a signal that indicates (e.g., represents) the relative humidity that is detected by the humidity sensor 244.

The thermal testing system 200 further includes a temperature sensor 246. The temperature sensor 246 is configured to detect a temperature of the fluid and/or any one or more of the components of the thermal testing system 200 and/or an environment of any one or more of the components. For instance, the temperature sensor 246 may be configured to detect a temperature of the first heat exchanger 212, the second heat exchanger 216, the first semiconductor device 218, a circuit board on which the first semiconductor device 218 is attached, the third heat exchanger 222, the fourth heat exchanger 226, the second semiconductor device 228, a circuit board on which the second semiconductor device 228 is attached, the fifth heat exchanger 232, the sixth heat exchanger 236, the third semiconductor device 238, and/or a circuit board on which the third semiconductor device 238 is attached. The temperature sensor 246 is further configured to generate a signal that indicates the temperature that is detected by the temperature sensor 246.

The thermal testing system 200 further includes a flow sensor 248. In an example implementation, the flow sensor 248 is configured to detect a rate at which air flows in a chamber 240 in which the first semiconductor device 218 is located. In accordance with this implementation, the flow sensor 248 is further configured to generate a signal that indicates the rate at which the air flows, as detected by the flow sensor 248. In another example implementation, the flow sensor 248 is configured to detect a rate of flow of the fluid. In accordance with this implementation, the flow sensor 248 is further configured to generate a signal that indicates the rate at which the fluid flows, as detected by the flow sensor 248. In yet another example implementation, the flow sensor 248 is configured to detect an amount of the fluid that is stored in a fluid pump (e.g., fluid pump 108). In accordance with this implementation, the flow sensor 248 is further configured to generate a signal that indicates the amount of the fluid that is stored in the fluid pump, as detected by the flow sensor 248.

The thermal testing system 200 further includes a processing system 250. An example of a processing system is a system that includes at least one processor that is capable of manipulating data in accordance with a set of instructions. For instance, a processing system may be a computer, a personal digital assistant, etc. The processing system 250 is configured to perform any of a variety of operations to facilitate thermal testing of the first semiconductor device 218, the second semiconductor device 228, and/or the third semiconductor device 238. For instance, the processing system 250 may implement a thermal testing process to test operation of the first semiconductor device 218, the second semiconductor device 228, and/or the third semiconductor device 238 while a temperature of each semiconductor device that is being thermally tested is set to a target temperature in accordance with any one or more of the techniques described herein.

The thermal testing system 200 further includes a current sensor 262. The current sensor is configured to detect currents that are provided to the first TEC 214a, the second TEC 214b, the third TEC 224a, the fourth TEC 224b, the fifth TEC 234a, and the sixth TEC 234b, respectively. The current sensor 262 is further configured to generate signals that indicate the currents that are detected by the current sensor 262.

The thermal testing system 200 further includes a pressure sensor 264. The pressure sensor 264 is configured to detect a pressure between the second heat exchanger 216 and the first semiconductor device 218, a pressure between the fourth heat exchanger 226 and the second semiconductor device 228, and a pressure between the sixth heat exchanger 236 and the third semiconductor device 238. The pressure sensor 264 is further configured to generate signals that indicate the pressures that are detected by the pressure sensor 264.

The thermal testing system 200 further includes an interface 266. The interface 266 is configured to generate an indicator that indicates an attribute detected by any of the sensors in the thermal testing system 200. For example, the interface 266 may generate an indicator to convey information about a relative humidity that is detected by the humidity sensor 244. In accordance with this example, the interface 266 may generate the indicator based on a signal that indicates the relative humidity and that is received from the humidity sensor 244.

In another example, the interface 266 may generate an indicator to convey information about a temperature that is detected by the temperature sensor 246. In accordance with this example, the interface 266 may generate the indicator based on a signal that indicates the temperature and that is received from the temperature sensor 246.

In yet another example, the interface 266 may generate an indicator to convey information about a rate at which air flows in a chamber (e.g., chamber 240), as detected by the flow sensor 248. In accordance with this example, the interface 266 may generate the indicator based on a signal that indicates the rate and that is received from the flow sensor 248.

In still another example, the interface 266 may generate an indicator to convey information about a current that is detected by the current sensor 262. In accordance with this example, the interface 266 may generate the indicator based on a signal that indicates the current and that is received from the current sensor 262.

In yet another example, the interface 266 may generate an indicator to convey information about a pressure that is detected by the pressure sensor 264. In accordance with this example, the interface 266 may generate the indicator based on a signal that indicates the pressure and that is received from the pressure sensor 264.

In an example embodiment, the temperature sensor 246 is configured to detect a temperature of each of the second heat exchanger 216, the fourth heat exchanger 226, and the sixth heat exchanger 236. In further accordance with this embodiment, each of the variable voltage sources 230 is configured to not provide the respective input voltage to the respective TEC based at least in part on the temperature of the heat exchanger (i.e., the second heat exchanger 216, the fourth heat exchanger 226, or the sixth heat exchanger 236) associated with the respective TEC, as detected by the temperature sensor 246, having an absolute value that is greater than or equal to a temperature threshold. Not providing an input voltage to a TEC may include not initiating the providing of the input voltage or discontinuing the providing of the input voltage. An input voltage may be provided to a respective TEC based on the respective voltage source being manually reset (e.g., by a user of the thermal testing system 200). In a first example, the absolute value of a temperature may be greater than or equal to the temperature threshold based on the temperature being a positive number and not being less than the temperature threshold. In second example, the absolute value of a temperature may be greater than or equal to the temperature threshold based on the temperature being negative and not being greater than the temperature threshold.

In another example embodiment, the temperature sensor 246 is configured to detect a temperature of a circuit board to which a designated semiconductor device (i.e., the first semiconductor device 218, the second semiconductor device 228, or the third semiconductor device 238) is attached. In accordance with this example, the thermal controller is configured to conditionally provide power to the circuit board. For instance, the thermal controller 202 is configured to not provide the power to the circuit board based at least in part on the temperature of the circuit board, as detected by the temperature sensor 246, having an absolute value that is greater than or equal to a temperature threshold. Not providing the power to the circuit board may include not initiating the providing of the power or discontinuing the providing of the power. The thermal controller 202 may be configured to provide the power to the circuit board based on the thermal controller 202 being manually reset.

In yet another example embodiment, a fluid pump (e.g., fluid pump 108 of FIG. 1) is configured to pump the fluid (e.g., fluid 152 of FIG. 1) to the first heat exchanger 212, the third heat exchanger 222, and the fifth heat exchanger 232. In accordance with this embodiment, the temperature sensor 246 is configured to detect a temperature of a circuit board to which a designated semiconductor device is attached. In further accordance with this embodiment, the thermal controller 202 is configured to conditionally provide power to the fluid pump. For instance, the thermal controller 202 is configured to not provide the power to the fluid pump based at least in part on the temperature of the circuit board, as detected by the temperature sensor 246, having an absolute value that is greater than or equal to a temperature threshold. The thermal controller 202 may be configured to provide the power to the fluid pump based on the thermal controller 202 being manually reset.

In still another example embodiment, the humidity sensor 244 is configured to detect a relative humidity in an environment of a designated semiconductor device. In accordance with this embodiment, each of the variable voltage sources 230 that is associated with a thermal unit corresponding to the designated semiconductor device is configured to discontinue providing the respective input voltage to the respective TEC based at least in part on the relative humidity, as detected by the humidity sensor 244, being greater than or equal to a humidity threshold. Each of the variable voltage sources 230 that is associated with the thermal unit corresponding to the designated semiconductor device may be configured to automatically resume providing the respective input voltage to the respective TEC based at least in part on the relative humidity, as detected by the humidity sensor 244, decreasing below the humidity threshold.

In another example embodiment, the flow sensor 248 is configured to detect a rate at which air flows in a chamber 240 in which the first semiconductor device 218 is located. In accordance with this embodiment, each of the variable voltage sources 230 that provides an input voltage to the first TEC 214a or the second TEC 214b is configured to discontinue providing the respective input voltage to the respective TEC based at least in part on the rate at which air flows in the chamber 240, as detected by the flow sensor 248, being greater than or equal to a rate threshold.

In yet another example embodiment, the first semiconductor device 218 and the second semiconductor device 228 are attached to a common (e.g., same) circuit board. In accordance with this embodiment, the processing system 250 is configured to simultaneously test the first semiconductor device 218 and the second semiconductor device 228 while a first subset of the variable voltage sources 230 controls the first and second TECs 214a-214b to have a first cumulative target temperature differential across the first and second TECs 214a-214b and a second subset of the variable voltage sources controls the third and fourth TECs 224a-224b to have a second cumulative target temperature differential across the third and fourth TECs 224a-224b that is different from the first cumulative target temperature differential.

In still another example embodiment, the variable voltage sources 230 include first and second variable voltage sources that are configured to set (e.g., collaboratively set) a temperature in the chamber 240 in which the first semiconductor device 218 is located to equal a target temperature by controlling the respective first and second TECs 214a-214b.

In another example embodiment, the thermal testing system 200 further includes first, second, and third chambers configured to house the respective first, second, and third semiconductor devices 218, 228, and 238 during testing of the first, second, and third semiconductor devices 218, 228, and 238. In accordance with this embodiment, subsets of the variable voltage sources 230 are configured to set respective temperatures in the chambers to equal respective target temperatures by controlling respective subsets of the TECs. For instance, a first subset of the variable voltage sources 230 may control the first and second TECs 214a-214b to set the temperature in the first chamber. A second subset of the variable voltage sources 230 may control the third and fourth TECs 224a-224b to set the temperature in the second chamber. A third subset of the variable voltage sources 230 may control the fifth and sixth TECs 234a-234b to set the temperature in the third chamber.

In yet another example embodiment, a fluid pump (e.g., fluid pump 108 of FIG. 1) is configured to pump the fluid (e.g., fluid 152 of FIG. 1) to the first heat exchanger 212, the third heat exchanger 222, and the fifth heat exchanger 232. In accordance with this embodiment, each of the variable voltage sources 230 is configured to discontinue providing the respective input voltage to the respective TEC (e.g., TEC 214a, 214b, 224a, 224b, 234a, or 234b) based at least in part on a determination that the fluid pump encounters a technical issue. For instance, the processing system 250 may analyze any of a variety of factors (e.g., a flow rate of the fluid, an amount of the fluid in a reservoir of the fluid pump, and/or a temperature of the fluid) to determine whether the fluid pump encounters a technical issue. If the processing system 250 determines that the fluid pump has encountered a technical issue, the processing system 250 may provide a signal to the variable voltage sources 230 that causes the variable voltage sources 230 to discontinue providing the respective input voltages to the respective TECs.

In an aspect of this embodiment, the thermal controller 202 is configured to generate a voltage to control a circuit board to which a designated semiconductor device (e.g., the first semiconductor device 218, the second semiconductor device 228, or the third semiconductor device 238) is attached. In accordance with this aspect, the thermal controller 202 is further configured to not provide the voltage to the circuit board based at least in part on the determination that the fluid pump encounters the technical issue.

In another aspect of this example, the flow sensor 248 is configured to detect a rate of flow of the fluid (e.g., fluid 152 of FIG. 1) that is received at the first heat exchanger 212, the third heat exchanger 222, and the fifth heat exchanger 232 from the fluid pump. In accordance with this aspect, each of the variable voltage sources 230 is configured to discontinue providing the respective input voltage to the respective TEC based at least in part on the rate of flow of the fluid, as detected by the flow sensor 248, being less than or equal to a flow threshold. In further accordance with this aspect, the technical issue includes the rate of flow of the fluid being less than or equal to the flow threshold.

In yet another aspect of this example, the flow sensor 248 is configured to detect an amount of the fluid that is stored in the fluid pump. In accordance with this aspect, each of the variable voltage sources 230 is configured to discontinue providing the respective input voltage to the respective TEC based at least in part on the amount of the fluid that is stored in the fluid pump, as detected by the flow sensor 248, being less than or equal to an amount threshold. In further accordance with this aspect, the technical issue includes the amount of the fluid that is stored in the fluid pump being less than or equal to the amount threshold. For instance, the fluid pump may store substantially no fluid. Whether the variable voltage sources 230 discontinue providing the respective input voltages may be based at least in part on whether the fluid is detected.

In still another aspect of this example, the temperature sensor 246 is configured to detect a temperature of the fluid. In accordance with this aspect, each of the variable voltage sources 230 is configured to discontinue providing the respective input voltage to the respective TEC based at least in part on the temperature of the fluid, as detected by the temperature sensor 246, being greater than or equal to a temperature threshold. In further accordance with this aspect, the technical issue includes the temperature of the fluid being greater than or equal to the temperature threshold.

In still another example embodiment, the processing system 250 is configured to identify a target temperature of a designated semiconductor device (e.g., the first semiconductor device 218, the second semiconductor device 228, or the third semiconductor device 238) by reviewing a temperature indicator that indicates the target temperature, which is manually set by a user of the thermal testing system or which is programmatically set by software. In accordance with this embodiment, the processing system 250 is further configured to determine whether a human or programmatic error occurs with regard to setting of the target temperature based at least in part on whether an absolute value of the target temperature is greater than or equal to a first temperature threshold. In further accordance with this embodiment, the processing system 250 is further configured to cause each of the variable voltage sources 230 to not provide the respective input voltage to the respective TEC (e.g., TEC 214*a*, 214*b*, 224*a*, 224*b*, 234*a*, or 234*b*) based at least in part on a determination that the human or programmatic error occurs with regard to the setting of the target temperature as a result of the absolute value of the target temperature being greater than or equal to the first temperature threshold.

In an aspect of this embodiment, the thermal controller 202 is configured to generate a voltage to control a circuit board to which the designated semiconductor device is attached. In accordance with this aspect, the thermal controller 202 is further configured to not provide the voltage to the circuit board based at least in part on the determination that the human or programmatic error occurs with regard to the setting of the target temperature as a result of the absolute value of the target temperature being greater than or equal to the first temperature threshold. In an example implementation, the thermal controller 202 is configured to not provide the voltage to the circuit board further based at least in part on the absolute value of the target temperature being greater than or equal to a second temperature threshold that is greater than the first temperature threshold. In accordance with this implementation, the thermal controller 202 may be configured to generate a voltage to control a fluid pump from which the fluid is received by the first heat exchanger 212, the third heat exchanger 222, and the fifth heat exchanger 232. In further accordance with this implementation, the thermal controller 202 may be further configured to not provide the voltage to the fluid pump based at least in part on the determination that the human or programmatic error occurs with regard to the setting of the target temperature as a result of the absolute value of the target temperature being greater than or equal to the first temperature threshold and further based at least in part on the absolute value of the target temperature being greater than or equal to a third temperature threshold that is greater than the second temperature threshold.

In another aspect of this embodiment, the interface 266 is configured to generate an indicator, which indicates that the human or programmatic error has occurred with regard to the setting of the target temperature, based at least in part on the determination that the human or programmatic error occurs with regard to the setting of the target temperature. In an example implementation, the indicator further indicates that the variable voltage sources 230 are to be reset manually to enable the variable voltage sources 230 to provide the respective input voltages to the respective TECs. In another example implementation, the interface 266 is further configured to generate a threshold indicator, which indicates the first temperature threshold, based at least in part on the determination that the human or programmatic error occurs with regard to the setting of the target temperature.

In yet another aspect of this embodiment, the processing system 250 is further configured to perform a thermal testing process with regard to each of the semiconductor devices 218, 228, and 238 while an absolute value of a temperature of the respective semiconductor device is less than the temperature threshold. In accordance with this aspect, the processing system 250 is further configured to discontinue performance of the thermal testing process with regard to each of the semiconductor devices 218, 228, and 238 based at least in part on the absolute value of the temperature of the respective semiconductor device being greater than or equal to the temperature threshold.

In another example embodiment, the current sensor 262 is configured to detect currents that are provided to the respective TECs 214*a*, 214*b*, 224*a*, 224*b*, 234*a*, and 234*b*. In accordance with this embodiment, each of the variable voltage sources 230 is configured to discontinue providing the respective input voltage to the respective TEC based at least in part on a magnitude of the current that is provided to the respective TEC, as detected by the current sensor 262, being less than or equal to a current threshold. For instance, the magnitude of any one or more of the currents may be substantially zero (e.g., no greater than a noise floor detected by the current sensor 262). It should be noted that a TEC may include multiple parallel-connected p-n cells, and a resistance of the TEC (e.g., the resistance between the first and second opposing surfaces of the TEC) may increase based on one or more of the p-n cells in the TEC failing. An increase in the resistance of a TEC results in a decrease in the current that is provided to (e.g., consumed by) the TEC.

In an aspect of this embodiment, the thermal controller 202 is configured to generate a voltage to control a circuit board to which a designated semiconductor device (e.g., the first semiconductor device 218, the second semiconductor device 228, or the third semiconductor device 238) is attached. In accordance with this aspect, the thermal controller 202 is further configured to not provide the voltage to the circuit board based at least in part on the magnitude of the current that is provided to the respective thermoelectric cooler, as detected by the current sensor 262, being less than or equal to the current threshold.

In another aspect of this embodiment, the interface 266 is configured to generate a first indicator or a second indicator depending on whether each current in a subset (e.g., one or all) of the currents is modulated. In accordance with this aspect, the interface 266 is configured to generate the first indicator based on each current in the subset of the currents being modulated. For instance, the first indicator may include a modulated sound and/or a pulsed (e.g., blinking) light. In further accordance with this aspect, the interface 266 is configured to generate the second indicator based on each current in the subset of the currents being unmodulated. For instance, the second indicator may include an unmodulated sound and/or a non-blinking (e.g., relatively constant) light.

In yet another aspect of this embodiment, the interface 266 is configured to generate multiple indicators that indicate the respective magnitudes of the respective currents.

In still another aspect of this embodiment, the interface 266 is configured to generate an alarm regarding each of the currents that has a magnitude, as detected by the current sensor 262, that is less than or equal to the current threshold.

In another aspect of this embodiment, the interface 266 is configured to generate multiple alarms related to respective current thresholds. In accordance with this aspect, the interface 266 is configured to generate each of the alarms based at least in part on a magnitude of a current, as detected by the current sensor 262, being less than or equal to a respective current threshold. For instance, each current threshold may be different from each of the other current thresholds.

It will be recognized that the thermal testing system 200 may not include one or more of the components shown in FIG. 2. Furthermore, the thermal testing system 200 may include components in addition to or in lieu of any one or more of the components shown in FIG. 2.

Figure 3:
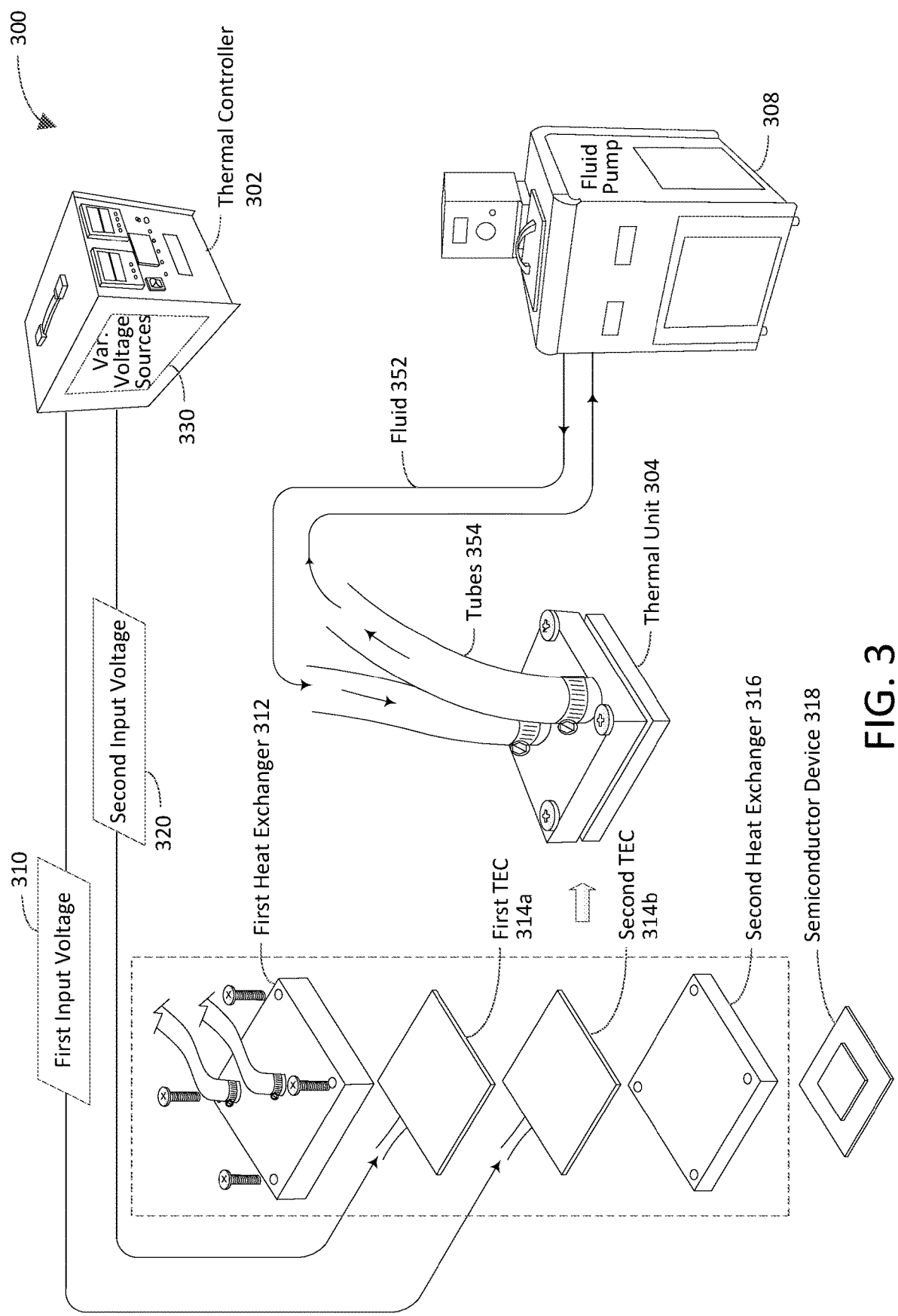

FIG. 3 is a block diagram of another example thermal testing system 300, which includes one thermal unit 304 for non-limiting, illustrative purposes, in accordance with an embodiment. Generally speaking, the thermal testing system 300 operates to set a temperature of the semiconductor device 318 (e.g., for the purpose of testing operation of the semiconductor device 318 at the temperatures). As shown in FIG. 3, the thermal testing system 300 includes a thermal controller 302, the thermal unit 304, a fluid pump 308, and a semiconductor device 318. The thermal unit 304 includes a first heat exchanger 312, a first TEC 314a, a second TEC 314b, and a second heat exchanger 316, which are operable in a manner similar to the first heat exchanger 212, the first TEC 214a, the second TEC 214b, and the second heat exchanger 216 described above with reference to FIG. 2. The thermal controller 302 and the fluid pump 308 are operable in a manner similar to the thermal controller 102 and the fluid pump 108 described above with reference to FIG. 1. For instance, the thermal controller 302 includes multiple variable voltage sources 330. The variable voltage sources 330 include a first variable voltage source that is configured to generate a first input voltage 310, which is configured to control the first TEC 314a. The variable voltage sources 330 include a second variable voltage source that is configured to generate a second input voltage 320, which is configured to control the second TEC 314b. The first and second TECs 314a-314b are positioned consecutively between the first and second heat exchangers 312 and 316. The fluid pump 308 is configured to pump a fluid 352 through tubes 354 to the first heat exchanger 312. For instance, the fluid 352 may flow through a cavity (e.g., tunnel) in the first heat exchanger 312 to change the temperature of the first heat exchanger 312. The semiconductor device 318 may be any suitable type of semiconductor device, including but not limited to a semiconductor chip, a semiconductor sensor, and a laser.

It will be recognized that the thermal testing system 300 may not include one or more of the components shown in FIG. 3. Furthermore, the thermal testing system 300 may include components in addition to or in lieu of the any one or more of the components shown in FIG. 3.

Figure 4:
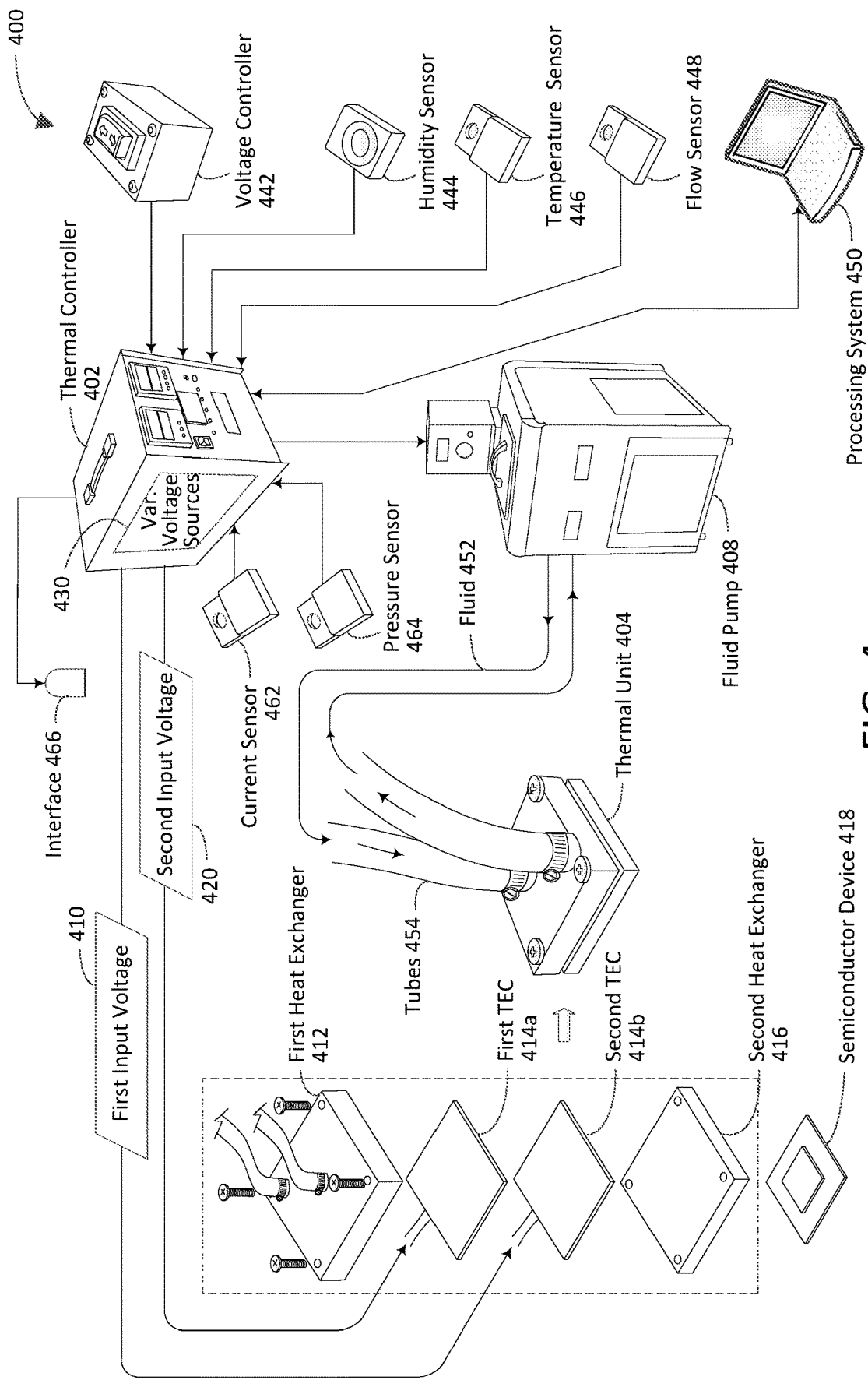

FIG. 4 is a block diagram of another example thermal testing system 400 in accordance with an embodiment. Generally speaking, the thermal testing system 400 operates to set a temperature of a semiconductor device 418. As shown in FIG. 4, the thermal testing system 400 includes a thermal controller 402, a thermal unit 404, a fluid pump 408, and the semiconductor device 418. The thermal unit 404 includes a first heat exchanger 412, a first TEC 414a, a second TEC 414b, and a second heat exchanger 416. The thermal controller 402, the fluid pump 408, the first heat exchanger 412, the first TEC 414a, the second TEC 414b, and the second heat exchanger 416 are operable in a manner similar to the thermal controller 302, the fluid pump 308, the first heat exchanger 312, the first TEC 314a, the second TEC 314b, and the second heat exchanger 316 described above with reference to FIG. 3. For instance, the variable voltage sources 430 generate first and second input voltages 410 and 420 to control the first and second TECs 414a-414b. The fluid pump 408 pumps fluid 452 through tubes 454 to the first heat exchanger 412.

The thermal testing system 400 further includes a voltage controller 442. The voltage controller 442 is a controller or a voltage source that is external to the thermal controller 402. The voltage controller 442 may be a variable voltage source (e.g., capable of generating any of a variety of voltages), a fixed voltage source (e.g., capable of generating a single, fixed voltage), or a controller (e.g., capable of changing input voltages provided by the variable voltage sources 430). The voltage controller 442 may be used in combination with or in lieu of any one or more of the variable voltage sources 430 to provide an input voltage to one of the first TEC 414a or the second TEC 414b.

The thermal testing system 400 further includes a humidity sensor 444. The humidity sensor 444 is configured to detect a relative humidity in an environment of the semiconductor device 418. The humidity sensor 444 is further configured to generate a signal that indicates (e.g., represents) the relative humidity that is detected by the humidity sensor 444.

The thermal testing system 400 further includes a temperature sensor 446. The temperature sensor 446 is configured to detect a temperature of any one or more of the components of the thermal testing system 400 and/or an environment of any one or more of the components. For instance, the temperature sensor 446 may be configured to detect a temperature of the first heat exchanger 412, the second heat exchanger 416, the semiconductor device 418, and/or a circuit board on which the semiconductor device 418 is attached. The temperature sensor 446 is further configured to generate a signal that indicates the temperature that is detected by the temperature sensor 446.

The thermal testing system 400 further includes a flow sensor 448. In an example implementation, the flow sensor 448 is configured to detect a rate at which air flows in a chamber in which the semiconductor device 418 is located. In accordance with this implementation, the flow sensor 448 is further configured to generate a signal that indicates the rate at which the air flows, as detected by the flow sensor 448. In another example implementation, the flow sensor 448 is configured to detect a rate of flow of the fluid 452. In accordance with this implementation, the flow sensor 448 is further configured to generate a signal that indicates the rate at which the fluid 452 flows, as detected by the flow sensor 448. In yet another example implementation, the flow sensor 448 is configured to detect an amount of the fluid 452 that is stored in a fluid pump 408. In accordance with this implementation, the flow sensor 448 is further configured to generate a signal that indicates the amount of the fluid 452 that is stored in the fluid pump 408, as detected by the flow sensor 448.

The thermal testing system 400 further includes a processing system 450. The processing system 450 is configured to perform any of a variety of operations to facilitate thermal testing of the semiconductor device 418. For instance, the processing system 450 may implement a thermal testing process to test operation of the semiconductor device 418 while a temperature of the semiconductor device 418 is set to a target temperature in accordance with any one or more of the techniques described herein.

The thermal testing system 400 further includes a current sensor 462. The current sensor is configured to detect currents that are provided to the first TEC 414a and the second TEC 414b, respectively. The current sensor 462 is further configured to generate signals that indicate the currents that are detected by the current sensor 462.

The thermal testing system 400 further includes a pressure sensor 464. The pressure sensor 464 is configured to detect a pressure between the second heat exchanger 416 and the semiconductor device 418. The pressure sensor 464 is further configured to generate signals that indicate the pressure that is detected by the pressure sensor 464.

The thermal testing system 400 further includes an interface 466. The interface 466 is configured to generate an indicator that indicates an attribute detected by any of the sensors in the thermal testing system 400. For example, the interface 466 may generate an indicator to convey information about a relative humidity that is detected by the humidity sensor 444. In accordance with this example, the interface 466 may generate the indicator based on a signal that indicates the relative humidity and that is received from the humidity sensor 444.

In another example, the interface 466 may generate an indicator to convey information about a temperature that is detected by the temperature sensor 446. In accordance with this example, the interface 466 may generate the indicator based on a signal that indicates the temperature and that is received from the temperature sensor 446.

In yet another example, the interface 466 may generate an indicator to convey information about a rate at which air flows in a chamber that includes the semiconductor device 418, as detected by the flow sensor 448. In accordance with this example, the interface 466 may generate the indicator based on a signal that indicates the rate and that is received from the flow sensor 448.

In still another example, the interface 466 may generate an indicator to convey information about a current that is detected by the current sensor 462. In accordance with this example, the interface 466 may generate the indicator based on a signal that indicates the current and that is received from the current sensor 462.

In yet another example, the interface 466 may generate an indicator to convey information about a pressure that is detected by the pressure sensor 464. In accordance with this example, the interface 466 may generate the indicator based on a signal that indicates the pressure and that is received from the pressure sensor 464.

In an example embodiment, the variable voltage sources 430 are configured to modify a temperature of the semiconductor device 418, which is attached to a circuit board, to equal a target temperature by generating the respective input voltages without modifying temperatures of other respective semiconductor devices that are attached to the circuit board.

In another example embodiment, the temperature sensor 446 is configured to detect a temperature of the second heat exchanger 416. In accordance with this embodiment, each of the variable voltage sources 430 is configured to not provide the respective input voltage to the respective TEC based at least in part on the temperature of the second heat exchanger 416, as detected by the temperature sensor 446, having an absolute value that is greater than or equal to a temperature threshold. Each input voltage may thereafter be provided based on the respective variable voltage source being manually reset.

In yet another example embodiment, the temperature sensor 446 is configured to detect a temperature of a circuit board to which the semiconductor device 418 is attached. In accordance with this embodiment, the thermal controller 402 is configured to conditionally provide power to the circuit board. The thermal controller 402 is configured to not provide the power to the circuit board based at least in part on the temperature of the circuit board, as detected by the temperature sensor 446, having an absolute value that is greater than or equal to a temperature threshold. The thermal controller 402 may thereafter provide the power to the circuit board based on the thermal controller 402 being manually reset.

In still another example embodiment, the humidity sensor 444 is configured to detect a relative humidity in an environment of the semiconductor device 418. In accordance with this embodiment, each of the variable voltage sources 430 is configured to discontinue providing the respective input voltage to the respective TEC based at least in part on the relative humidity, as detected by the humidity sensor 444, being greater than or equal to a humidity threshold. In an aspect of this embodiment, each of the variable voltage sources 430 is configured to automatically resume providing the respective input voltage to the respective TEC based at least in part on the relative humidity, as detected by the humidity sensor 444, decreasing below the humidity threshold.

In another example embodiment, the flow sensor 448 is configured to detect a rate at which air flows in a chamber in which the semiconductor device 418 is located. In accordance with this embodiment, each of the variable voltage sources 430 is configured to discontinue providing the respective input voltage to the respective TEC based at least in part on the rate at which air flows in the chamber, as detected by the flow sensor 448, being greater than or equal to a rate threshold.

In yet another example embodiment, the variable voltage sources 430 are configured to set a temperature in a chamber in which the semiconductor device 418 is located to equal a target temperature by controlling the respective first and second TECs 414a-414b.

In still another example embodiment, the current sensor 462 is configured to detect at least one current from the currents that are provided to the respective first and second TECs 414a-414b. In accordance with this embodiment, the interface 466 is configured to generate an indicator that indicates an attribute of the at least one current. For instance, each current may represent a working status of the respective TEC. The interface may include a light, a speaker, and/or a display via which the indicator may be provided. For example, the indicator may be a human-perceptible indicator, such as a light and/or a sound. The attribute may indicate that the at least one current is modulated (e.g., pulse-width modulated) or that the at least one current is unmodulated. The at least one current being modulated may indicate that the less than full power is being provided to the TEC(s) to which the at least one current is applied. The at least one current being unmodulated may indicate that full power is being provided to the TEC(s) to which the at least one current is applied. In an example implementation, the interface includes a light-emitting diode (LED) that is set to an "on" state if the at least one current is unmodulated and that is set to a "blinking" state if the at least one current is modulated.

In another example embodiment, the current sensor 462 is configured to detect currents that are provided to the respective first and second TECs 414a-414b. In accordance with this embodiment, each of the variable voltage sources 430 is configured to discontinue providing the respective input voltage to the respective TEC based at least in part on the current that is provided to the respective TEC, as detected by the current sensor 462, being less than or equal to a current threshold. For instance, a current being less than or equal to the current threshold may indicate an end of life of the respective TEC. In an aspect of this embodiment, the interface 466 is configured to generate indicators such that each indicator indicates whether the respective current, as detected by the current sensor 462, is less than or equal to the current threshold. For instance, a human who is overseeing the thermal testing process may observe the indicators to determine which TEC(s) are to be replaced.

In yet another example embodiment, the pressure sensor 464 is configured to detect a pressure between the second heat exchanger 416 and the semiconductor device 418. In accordance with this embodiment, each of the variable voltage sources 430 is configured to discontinue providing the respective input voltage to the respective TEC based at least in part on the pressure between the second heat exchanger 416 and the semiconductor device 418, as detected by the pressure sensor 464, being less than or equal to a pressure threshold. It will be recognized that each of the variable voltage sources 430 may be configured to delay initiating the providing of the respective input voltage to the respective TEC based at least in part on the pressure being less than or equal to the pressure threshold.

In still another example embodiment, the pressure sensor 464 is configured to detect a pressure between the second heat exchanger 416 and the semiconductor device 418, which is attached to a circuit board. In accordance with this embodiment, the thermal controller 402 is configured to conditionally provide power to the circuit board. The thermal controller 402 is configured to not provide the power to the circuit board based at least in part on the pressure between the second heat exchanger 416 and the semiconductor device 418, as detected by the pressure sensor 464, being less than or equal to a pressure threshold. It will be recognized that the thermal controller 402 may be configured to delay initiating the providing of the power to the circuit board based at least in part on the pressure being less than or equal to the pressure threshold.

In another example embodiment, each of the variable voltage sources 430 is configured to discontinue providing the respective input voltage to the respective TEC (e.g., the first TEC 414a or the second TEC 414b) based at least in part on a determination that the fluid pump 408 encounters a technical issue. For instance, the processing system 450 may analyze any of a variety of factors (e.g., a flow rate of the fluid 452, an amount of the fluid 452 in the fluid pump 408, and/or a temperature of the fluid 452) to determine whether the fluid pump 408 encounters a technical issue. If the processing system 450 determines that the fluid pump 408 has encountered a technical issue, the processing system 450 may provide a signal to the variable voltage sources 430 that causes the variable voltage sources 430 to discontinue providing the respective first and second input voltages 410 and 420 to the respective first and second TECs 414a-414b.

In an aspect of this embodiment, the thermal controller 402 is configured to generate a voltage to control a circuit board to which the semiconductor device 418 is attached. In accordance with this aspect, the thermal controller 402 is further configured to not provide the voltage to the circuit board based at least in part on the determination that the fluid pump 408 encounters the technical issue.

In another aspect of this example, the flow sensor 448 is configured to detect a rate of flow of the fluid 452. In accordance with this aspect, each of the variable voltage sources 430 is configured to discontinue providing the respective input voltage to the respective TEC based at least in part on the rate of flow of the fluid 452, as detected by the flow sensor 448, being less than or equal to a flow threshold. In further accordance with this aspect, the technical issue includes the rate of flow of the fluid 452 being less than or equal to the flow threshold.

In yet another aspect of this example, the flow sensor 448 is configured to detect an amount of the fluid 452 that is stored in the fluid pump 408. In accordance with this aspect, each of the variable voltage sources 430 is configured to discontinue providing the respective input voltage to the respective TEC based at least in part on the amount of the fluid 452 that is stored in the fluid pump 408, as detected by the flow sensor 448, being less than or equal to an amount threshold. In further accordance with this aspect, the technical issue includes the amount of the fluid 452 that is stored in the fluid pump 408 being less than or equal to the amount threshold. For instance, the fluid pump 408 may store substantially no fluid 452. Whether the variable voltage sources 430 discontinue providing the respective first and second input voltages 410 and 420 may be based at least in part on whether the fluid 452 is detected.

In still another aspect of this example, the temperature sensor 446 is configured to detect a temperature of the fluid 452. In accordance with this aspect, each of the variable voltage sources 430 is configured to discontinue providing the respective input voltage to the respective TEC based at least in part on the temperature of the fluid 452, as detected by the temperature sensor 446, being greater than or equal to a temperature threshold. In further accordance with this aspect, the technical issue includes the temperature of the fluid 452 being greater than or equal to the temperature threshold.

In yet another example embodiment, the processing system 450 is configured to identify a target temperature of the semiconductor device 418 by reviewing a temperature indicator that indicates the target temperature, which is manually set by a user of the thermal testing system or which is programmatically set by software. In accordance with this embodiment, the processing system 450 is further configured to determine whether a human or programmatic error occurs with regard to setting of the target temperature based at least in part on whether an absolute value of the target temperature is greater than or equal to a first temperature threshold. In further accordance with this embodiment, the processing system 450 is further configured to cause each of the variable voltage sources 430 to not provide the respective input voltage to the respective TEC based at least in part on a determination that the human or programmatic error occurs with regard to the setting of the target temperature as a result of the absolute value of the target temperature being greater than or equal to the first temperature threshold.

In an aspect of this embodiment, the thermal controller 402 is configured to generate a voltage to control a circuit board to which the semiconductor device 418 is attached. In accordance with this aspect, the thermal controller 402 is further configured to not provide the voltage to the circuit board based at least in part on the determination that the human or programmatic error occurs with regard to the setting of the target temperature as a result of the absolute value of the target temperature being greater than or equal to the first temperature threshold. In an example implementation, the thermal controller 402 is configured to not provide the voltage to the circuit board further based at least in part on the absolute value of the target temperature being greater than or equal to a second temperature threshold that is greater than the first temperature threshold. In accordance with this implementation, the thermal controller 402 may be configured to generate a voltage to control the fluid pump 408. In further accordance with this implementation, the thermal controller 402 may be further configured to not provide the voltage to the fluid pump 408 based at least in part on the determination that the human or programmatic error occurs with regard to the setting of the target temperature as a result of the absolute value of the target temperature being greater than or equal to the first temperature threshold and further based at least in part on the absolute value of the target temperature being greater than or equal to a third temperature threshold that is greater than the second temperature threshold.

In another aspect of this embodiment, the interface 466 is configured to generate an indicator, which indicates that the human or programmatic error has occurred with regard to the setting of the target temperature, based at least in part on the determination that the human or programmatic error occurs with regard to the setting of the target temperature. In an example implementation, the indicator further indicates that the variable voltage sources 430 are to be reset manually to enable the variable voltage sources 430 to provide the respective first and second input voltages 410 and 420 to the respective first and second TECs 414a-414b. In another example implementation, the interface 466 is further configured to generate a threshold indicator, which indicates the first temperature threshold, based at least in part on the determination that the human or programmatic error occurs with regard to the setting of the target temperature.

In yet another aspect of this embodiment, the processing system 450 is further configured to perform a thermal testing process with regard to the semiconductor device 418 while an absolute value of a temperature of the semiconductor device 418 is less than the temperature threshold. In accordance with this aspect, the processing system 450 is further configured to discontinue performance of the thermal testing process with regard to the semiconductor device 418 based at least in part on the absolute value of the temperature of the semiconductor device 418 being greater than or equal to the temperature threshold.

In still another example embodiment, the current sensor 462 is configured to detect first and second currents that are provided to the respective first and second TECs 414a-414b. In accordance with this embodiment, each of the variable voltage sources 430 is configured to discontinue providing the respective input voltage to the respective TEC based at least in part on a magnitude of the current that is provided to the respective TEC, as detected by the current sensor 462, being less than or equal to a current threshold.

In an aspect of this embodiment, the thermal controller 402 is configured to generate a voltage to control a circuit board to which the semiconductor device 418 is attached. In accordance with this aspect, the thermal controller 402 is further configured to not provide the voltage to the circuit board based at least in part on the magnitude of the current that is provided to the respective TEC, as detected by the current sensor 462, being less than or equal to the current threshold.

In another aspect of this embodiment, the interface 466 is configured to generate a first indicator or a second indicator depending on whether the first current and/or the second current is modulated. In accordance with this aspect, the interface 466 is configured to generate the first indicator based on the first current and/or the second current being modulated. For instance, the first indicator may include a modulated sound and/or a pulsed (e.g., blinking) light. In further accordance with this aspect, the interface 466 is configured to generate the second indicator based on the first current and/or the second current being unmodulated. For instance, the second indicator may include an unmodulated sound and/or a non-blinking (e.g., relatively constant) light.

In yet another aspect of this embodiment, the interface 466 is configured to generate first and second indicators that indicate the respective magnitudes of the respective first and second currents.

In still another aspect of this embodiment, the interface 466 is configured to generate an alarm regarding each of the first and second currents that has a magnitude, as detected by the current sensor 462, that is less than or equal to the current threshold.

In another aspect of this embodiment, the interface 466 is configured to generate multiple alarms related to respective current thresholds. In accordance with this aspect, the interface 466 is configured to generate each of the alarms based at least in part on a magnitude of the first or second current, as detected by the current sensor 462, being less than or equal to a respective current threshold. For instance, each current threshold may be different from each of the other current thresholds.

It will be recognized that the thermal testing system 400 may not include one or more of the components shown in FIG. 4. Furthermore, the thermal testing system 400 may include components in addition to or in lieu of the any one or more of the components shown in FIG. 4.

FIGS. 5-9 depict flowcharts 500, 600, 700, 800, and 900 of example methods for setting temperature(s) of respective semiconductor device(s) in a thermal testing environment in accordance with embodiments. Flowcharts 500, 600, 700, 800, and 900 may be performed by any of the thermal testing systems 100, 200, 300, and 400 shown in respective FIGS. 1-4. For illustrative purposes, flowcharts 500, 600, 700, 800, and 900 are described with respect to the thermal testing systems 100 and 200. Further structural and operational embodiments will be apparent to persons skilled in the relevant art(s) based on the discussion regarding flowcharts 500, 600, 700, 800, and 900.

Figure 5:
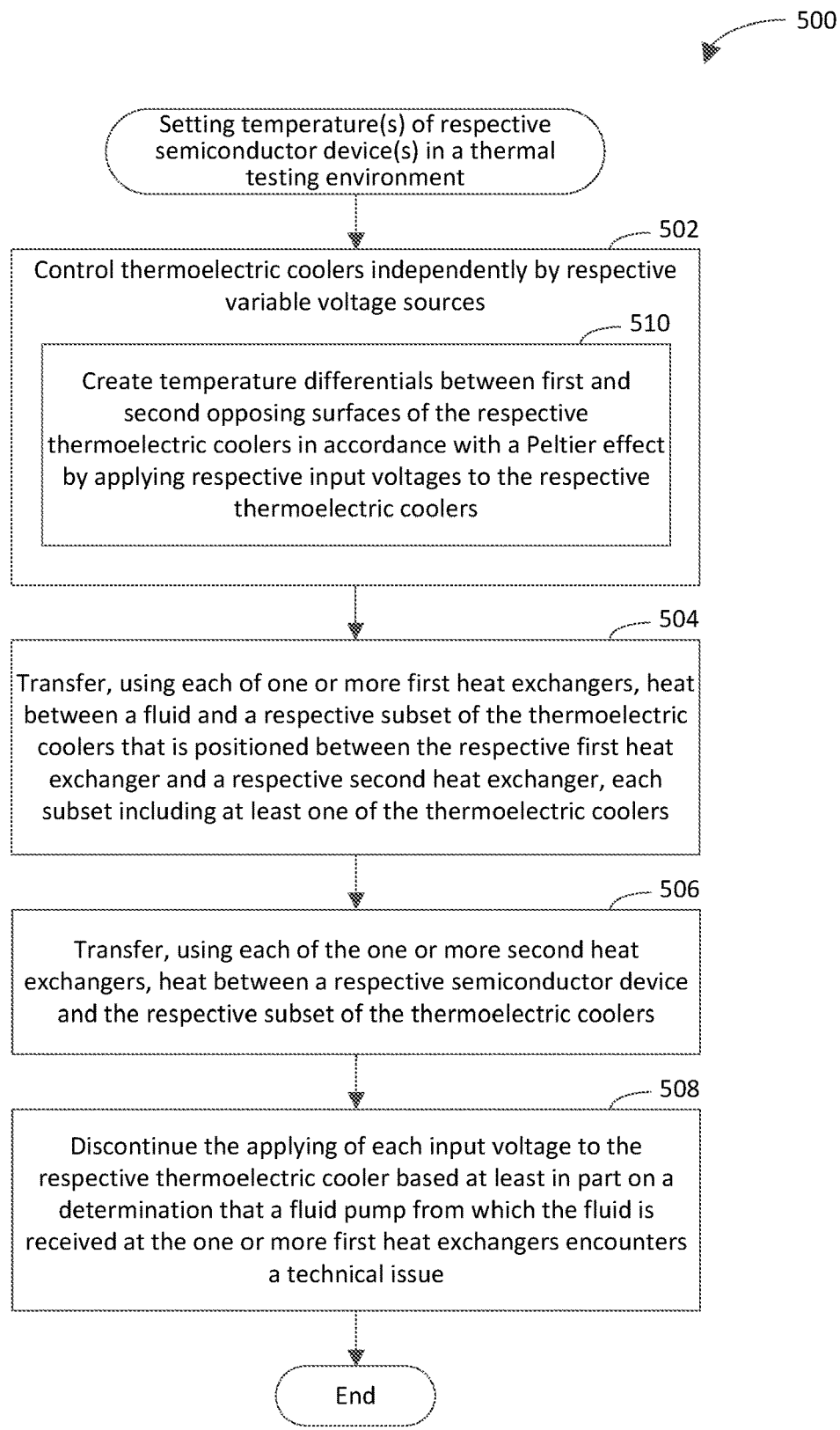
FIGS. 5-9 depict flowcharts of example methods for setting temperature(s) of respective semiconductor device(s) in a thermal testing environment in accordance with embodiments.

As shown in FIG. 5, the method of flowchart 500 begins at step 502. In step 502, thermoelectric coolers are controlled independently using (e.g., by) respective variable voltage sources. In an example implementation, the variable voltage sources 130 control the respective first and second TECs 114 and 124 independently.

In an example embodiment, controlling the thermoelectric coolers at step 502 includes setting (e.g., collaboratively setting), using a designated subset of the variable voltage sources, a temperature in a chamber in which a designated semiconductor device that is included among the semiconductor devices is located to equal a target temperature by controlling a designated subset of the thermoelectric coolers that is associated with the designated semiconductor device.

Step 502 includes step 510. At step 510, temperature differentials are created between first and second opposing surfaces of the respective thermoelectric coolers in accordance with a Peltier effect by applying respective input voltages to the respective thermoelectric coolers. In an example implementation, a first variable voltage source from the variable voltage sources 130 creates a first temperature differential between the first and second surfaces 158 and 160 of the first TEC 114 by applying the first input voltage 110 to the first TEC 114. In accordance with this implementation, a second variable voltage source from the variable voltage sources 130 creates a second temperature differential between the first and second surfaces 168 and 170 of the second TEC 124 by applying the second input voltage 120 to the second TEC 124.

At step 504, heat is transferred, using each of one or more first heat exchangers, between a fluid and a respective subset of the thermoelectric coolers that is positioned between the respective first heat exchanger and a respective second heat exchanger of one or more second heat exchangers. Each subset includes at least one of the thermoelectric coolers. In an example implementation, the first heat exchanger 112 transfers heat between the fluid 152 and the first TEC 114, which is positioned between the first heat exchanger 112 and the second heat exchanger 116. In accordance with this implementation, the third heat exchanger 122 transfers heat between the fluid 152 and the second TEC 124, which is positioned between the third heat exchanger 122 and the fourth heat exchanger 126.

At step 506, heat is transferred, using each of the one or more second heat exchangers, between a respective semiconductor device and the respective subset of the thermoelectric coolers. In an example implementation, the second heat exchanger 116 transfers heat between the first semiconductor device 118 and the first TEC 114. In accordance with this implementation, the fourth heat exchanger 126 transfers heat between the second semiconductor device 128 and the second TEC 124.

At step 508, applying each input voltage to the respective thermoelectric cooler is discontinued based at least in part on a determination that a fluid pump from which the fluid is received at the one or more first heat exchangers encounters a technical issue. In an example implementation, the variable voltage sources 130 discontinue the applying of each input voltage (e.g., first input voltage 110 or second input voltage 120) to the respective thermoelectric cooler (e.g., first TEC 114 or second TEC 124) based at least in part on a determination that the fluid pump 108 from which the fluid 152 is received at the first heat exchanger 112 and the third heat exchanger 122 encounters the technical issue.

In some example embodiments, one or more steps 502, 504, 506, 508, and/or 510 of flowchart 500 may not be performed. Moreover, steps in addition to or in lieu of steps 502, 504, 506, 508, and/or 510 may be performed. For instance, in an example embodiment, the method of flowchart 500 further includes detecting, using a temperature sensor, a temperature of a designated second heat exchanger. In an example implementation, the temperature sensor 246 detects the temperature of the designated second heat exchanger (e.g., second heat exchanger 116 or fourth heat exchanger 126). In accordance with this embodiment, the method of flowchart 500 further includes delaying, by each variable voltage source in a designated subset of the variable voltage sources that controls a designated subset of the thermoelectric coolers associated with the designated second heat exchanger, providing the respective input voltage to the respective thermoelectric cooler until a manual reset of the respective variable voltage source is performed, based at least in part on the temperature of the designated second heat exchanger having an absolute value that is greater than or equal to a temperature threshold. In an example implementation, each variable voltage source in a designated subset of the variable voltage sources 130 that controls a designated subset of the thermoelectric coolers (e.g., first TEC 114 or second TEC 124) associated with the designated second heat exchanger, delays providing the respective input voltage (e.g., first input voltage 110 or second input voltage 120) to the respective thermoelectric cooler until a manual reset of the respective variable voltage source is performed, based at least in part on the temperature of the designated second heat exchanger, as detected by the temperature sensor 246, having an absolute value that is greater than or equal to the temperature threshold. For instance, the processing system 250 may cause each variable voltage source in the designated subset of the variable voltage sources 130 to delay providing the respective input voltage to the respective thermoelectric cooler until a manual reset of the respective variable voltage source is performed.

In another example embodiment, the method of flowchart 500 further includes detecting, using a temperature sensor, a temperature of a circuit board to which a designated semiconductor device, which is included among the semiconductor device(s), is attached. In an example implementation, the temperature sensor 246 detects the temperature of the circuit board to which the designated semiconductor device (e.g., first semiconductor device 118 or second semiconductor device 128) is attached. In accordance with this embodiment, the method of flowchart 500 further includes conditionally providing power to the circuit board. The conditionally providing includes not providing the power to the circuit board based at least in part on the temperature of the circuit board having an absolute value that is greater than or equal to a temperature threshold. In an example implementation, the thermal controller 102 conditionally provides the power to the circuit board, which includes not providing the power to the circuit board based at least in part on the temperature of the circuit board, as detected by the temperature sensor 246, having an absolute value that is greater than or equal to the temperature threshold.

In yet another example embodiment, the method of flowchart 500 further includes detecting, using a flow sensor, a rate at which air flows in a chamber in which a designated semiconductor device, which is included among the semiconductor device(s), is located. In an example implementation, the flow sensor 248 detects the rate at which the air flows in the chamber in which the designated semiconductor device (e.g., the first semiconductor device 118 or the second semiconductor device 128) is located. In accordance with this embodiment, the method of flowchart 500 further includes discontinuing, by each variable voltage source associated with a designated subset of the thermoelectric coolers that is associated with the designated semiconductor device, providing the respective input voltage to the respective thermoelectric cooler in the designated subset based at least in part on the rate at which air flows in the chamber being greater than or equal to a rate threshold. In an example implementation, each variable voltage source associated with a designated subset of the thermoelectric coolers that is associated with the designated semiconductor device discontinues providing the respective input voltage (e.g., the first input voltage 110 or the second input voltage 120) to the respective thermoelectric cooler (e.g., first TEC 114 or second TEC 124) in the designated subset based at least in part on the rate at which air flows in the chamber, as detected by the flow sensor 248, being greater than or equal to the rate threshold.

In still another example embodiment, the semiconductor device(s) comprise at least a first semiconductor device and a second semiconductor device that are attached to a common circuit board. In an example implementation, at least the first semiconductor device 118 and the second semiconductor device 128 are attached to a common circuit board.

In accordance with this embodiment, the method of flowchart 500 further includes simultaneously testing at least the first semiconductor device and the second semiconductor device while a first subset of the variable voltage sources controls a first subset of the thermoelectric coolers, which is associated with the first semiconductor device, to have a first cumulative target temperature differential across the first subset of the thermoelectric coolers and a second subset of the variable voltage sources controls a second subset of the thermoelectric coolers, which is associated with the second semiconductor device, to have a second cumulative target temperature differential across the second subset of the thermoelectric coolers that is different from the first cumulative target temperature differential. In an example implementation, the processing system 250 simultaneously tests at least the first semiconductor device 118 and the second semiconductor device 128 while a first variable voltage source that is included among the variable voltage sources 130 controls the first TEC 114 to have a first target temperature differential across the first TEC 114 and a second variable voltage source that is included among the variable voltage sources 130 controls the second TEC 124 to have a second target temperature differential across the second TEC 124 that is different from the first target temperature differential.

In another example embodiment, the method of flowchart 500 further includes housing the semiconductor device(s) in respective chamber(s) during testing of the semiconductor device(s). In an example implementation, the first and second chambers 140 and 190 house the respective first and second semiconductor devices 118 and 128 during testing of the first and second semiconductor devices 118 and 128. In accordance with this embodiment, controlling the thermoelectric coolers independently at step 502 includes setting, by subsets of the variable voltage sources, respective temperatures in the respective chambers to equal respective target temperatures. For instance, subsets of the variable voltage sources 130 may set respective temperatures in the respective first and second chambers 140 and 190 to equal the respective target temperatures.

In yet another example embodiment, the method of flowchart 500 further includes generating a voltage to control a circuit board to which a designated semiconductor device, which is included among semiconductor device(s), is attached. In an example implementation, the thermal controller 102 generates the voltage to control the circuit board to which the designated semiconductor device (e.g., the first semiconductor device 118 or the second semiconductor device 128) is attached. In accordance with this embodiment, the method of flowchart 500 further includes not providing the voltage to the circuit board based at least in part on the determination that the fluid pump from which the fluid is received at the one or more first heat exchangers encounters the technical issue. In an example implementation, the thermal controller 102 does not provide the voltage to the circuit board based at least in part on the determination that the fluid pump 108 from which the fluid 152 is received at the first heat exchanger 112 and the third heat exchanger 122 encounters the technical issue.

In still another example embodiment, the method of flowchart 500 further includes detecting a rate of flow of the fluid that is received at the one or more first heat exchangers from the fluid pump. In an example implementation, the flow sensor 248 detects the rate of flow of the fluid 152 that is received at the first heat exchanger 112 and the third heat exchanger 122 from the fluid pump 108. In accordance with this embodiment, the method of flowchart 500 further includes discontinuing the applying of each input voltage to the respective thermoelectric cooler based at least in part on the rate of flow of the fluid being less than or equal to a flow threshold. In an example implementation, the variable voltage sources 130 discontinues the applying of the respective first and second input voltages 110 and 120 to the respective first and second TECs 114 and 124 based at least in part on the rate of the flow of the fluid 152 being less than or equal to the flow threshold. In further accordance with this embodiment, the technical issue includes the rate of flow of the fluid being less than or equal to the flow threshold.

In another example embodiment, the method of flowchart 500 further includes detecting an amount of the fluid that is stored in the fluid pump. In an example implementation, the flow sensor 248 detects an amount of the fluid 152 that is stored in the fluid pump 108. In accordance with this embodiment, the method of flowchart 500 further includes discontinuing the applying of each input voltage to the respective thermoelectric cooler based at least in part on the amount of the fluid that is stored in the fluid pump being less than or equal to an amount threshold. In an example implementation, the variable voltage sources 130 discontinue the applying of the respective first and second input voltages 110 and 120 to the respective TECs 114 and 124 based at least in part on the amount of the fluid 152 that is stored in the fluid pump 108 being less than or equal to the amount threshold. In further accordance with this embodiment, the technical issue includes the amount of the fluid that is stored in the fluid pump being less than or equal to the amount threshold.

In yet another example embodiment, the method of flowchart 500 further includes detecting a temperature of the fluid that is received at the one or more first heat exchangers from the fluid pump. In an example implementation, the temperature sensor 246 detects a temperature of the fluid 152 that is received at the first heat exchanger 112 and the third heat exchanger 122 from the fluid pump 108. In accordance with this embodiment, the method of flowchart 500 further includes discontinuing the applying of each input voltage to the respective thermoelectric cooler based at least in part on the temperature of the fluid being greater than or equal to a temperature threshold. In an example implementation, the variable voltage sources 130 discontinue the applying of the respective first and second input voltages 110 and 120 to the respective TECs 114 and 124 based at least in part on the temperature of the fluid 152 being greater than or equal to the temperature threshold. In further accordance with this embodiment, the technical issue includes the temperature of the fluid being greater than or equal to the temperature threshold.

Figure 6:
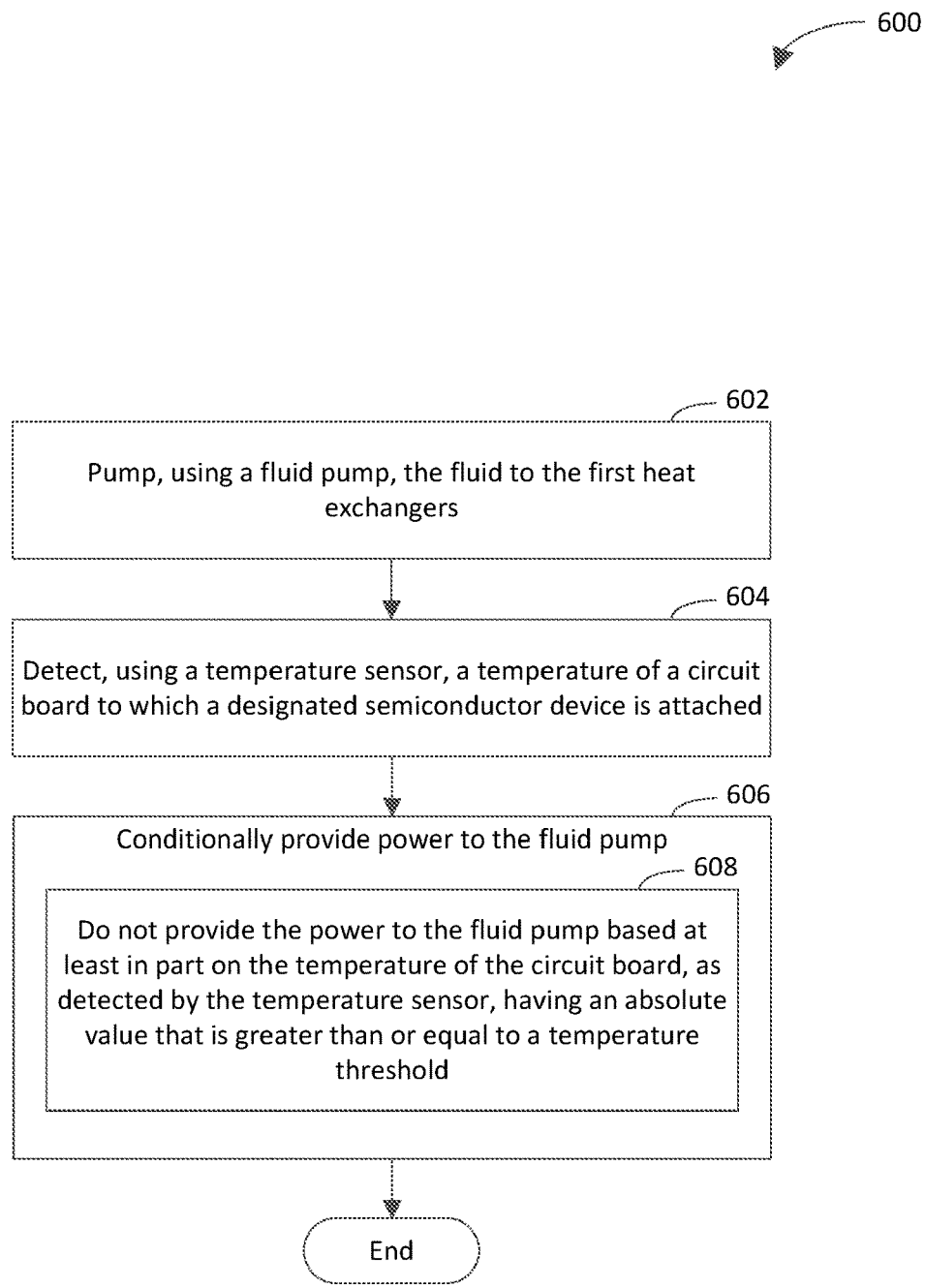

In still another example embodiment, the method of flowchart 500 further includes one or more of the steps shown in flowchart 600 of FIG. 6. As shown in FIG. 6, the method of flowchart 600 begins at step 602. In step 602, the fluid is pumped, using a fluid pump, to the first heat exchanger(s). In an example implementation, the fluid pump 108 pumps the fluid 152 to the first and third heat exchangers 112 and 122.

At step 604, a temperature of a circuit board to which a designated semiconductor device, which is included among the semiconductor device(s), is attached is detected using a temperature sensor. In an example implementation, the temperature sensor 246 detects the temperature of the circuit board to which the designated semiconductor device (e.g., first semiconductor device 118 or second semiconductor device 128) is attached.

At step 606, power is conditionally provided to the fluid pump. In an example implementation, the thermal controller 102 conditionally provides power to the fluid pump 108.

Step 606 includes step 608. At step 608, the power is not provided to the fluid pump based at least in part on the temperature of the circuit board having an absolute value that is greater than or equal to a temperature threshold. In an example implementation, the thermal controller 102 does not provide the power to the fluid pump 108 based at least in part on the temperature of the circuit board, as detected by the temperature sensor 246, having an absolute value that is greater than or equal to the temperature threshold.

Figure 7:
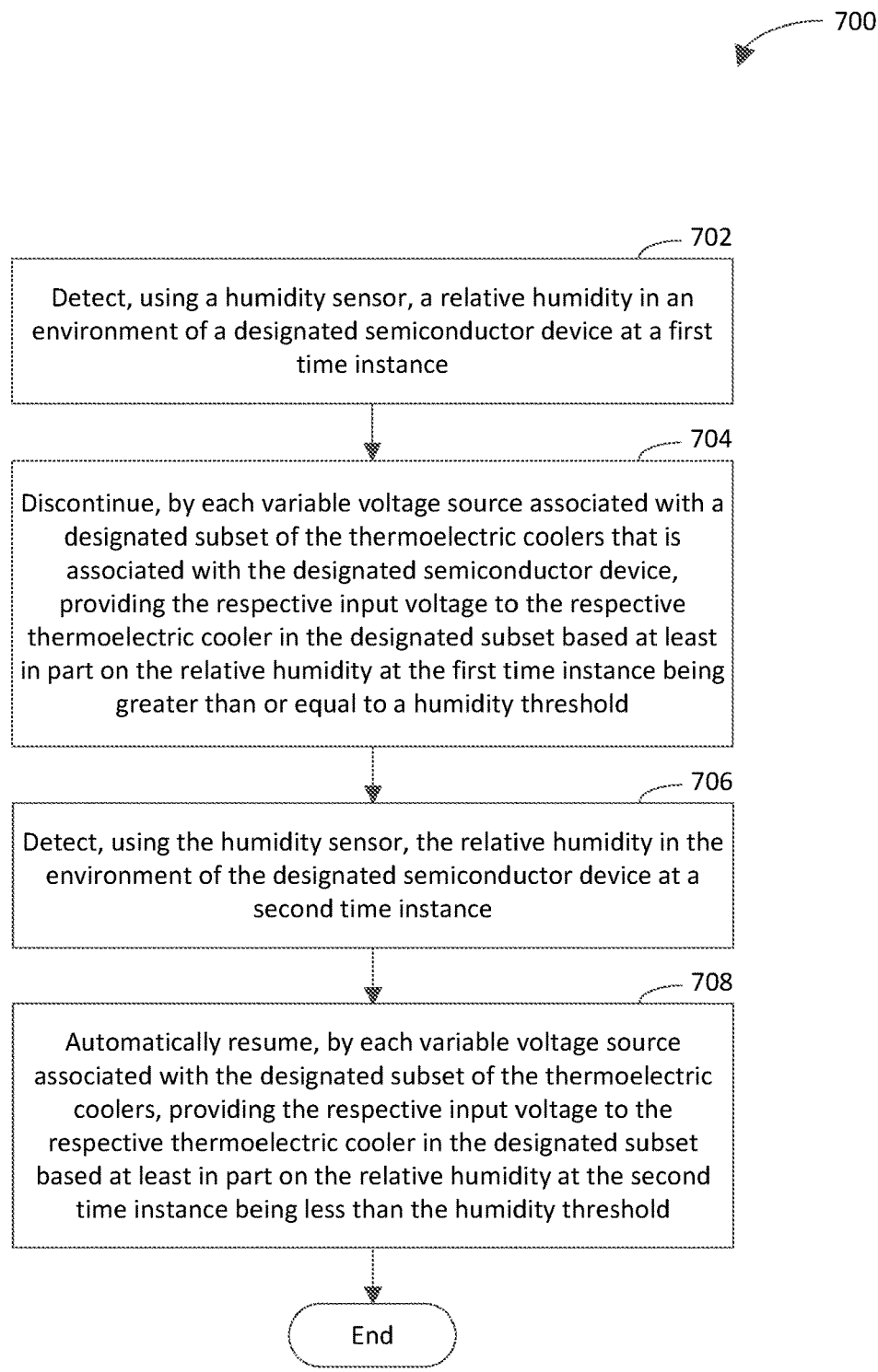

In another example embodiment, the method of flowchart 500 further includes one or more of the steps shown in flowchart 700 of FIG. 7. As shown in FIG. 7, the method of flowchart 700 begins at step 702. In step 702, a relative humidity in an environment of a designated semiconductor device, which is included among the semiconductor device(s), is detected using a humidity sensor at a first time instance. In an example implementation, the humidity sensor 244 detects the relative humidity in the environment of the designated semiconductor device (e.g., first semiconductor device 118 or second semiconductor device 128) at the first time instance.

At step 704, providing each input voltage to the respective thermoelectric cooler in a designated subset of the thermoelectric coolers that is associated with the designated semiconductor device is discontinued, by each variable voltage source associated with the designated subset of the thermoelectric coolers, based at least in part on the relative humidity at the first time instance being greater than or equal to a humidity threshold. In an example implementation, each of the variable voltage sources 130 associated with the designated subset of the thermoelectric coolers (e.g., first TEC 114 or second TEC 124) that is associated with the designated semiconductor device discontinues providing the respective input voltage (e.g., first input voltage 110 or second input voltage 120) to the respective thermoelectric cooler in the designated subset based at least in part on the relative humidity, as detected by the humidity sensor 244, at the first time instance being greater than or equal to the humidity threshold.

At step 706, the relative humidity in the environment of the designated semiconductor device is detected using the humidity sensor at a second time instance. In an example implementation, the humidity sensor 244 detects the relative humidity in the environment of the designated semiconductor device at the second time instance.

At step 708, providing each input voltage to the respective thermoelectric cooler in the designated subset of the thermoelectric coolers is automatically resumed, by each variable voltage source associated with the designated subset of the thermoelectric coolers, based at least in part on the relative humidity at the second time instance being less than the humidity threshold. In an example implementation, each of the variable voltage sources 130 associated with the designated subset of the thermoelectric coolers automatically resumes providing the respective input voltage to the respective thermoelectric cooler in the designated subset based at least in part on the relative humidity, as detected by the humidity sensor 244, at the second time instance being less than the humidity threshold.

Figure 8:
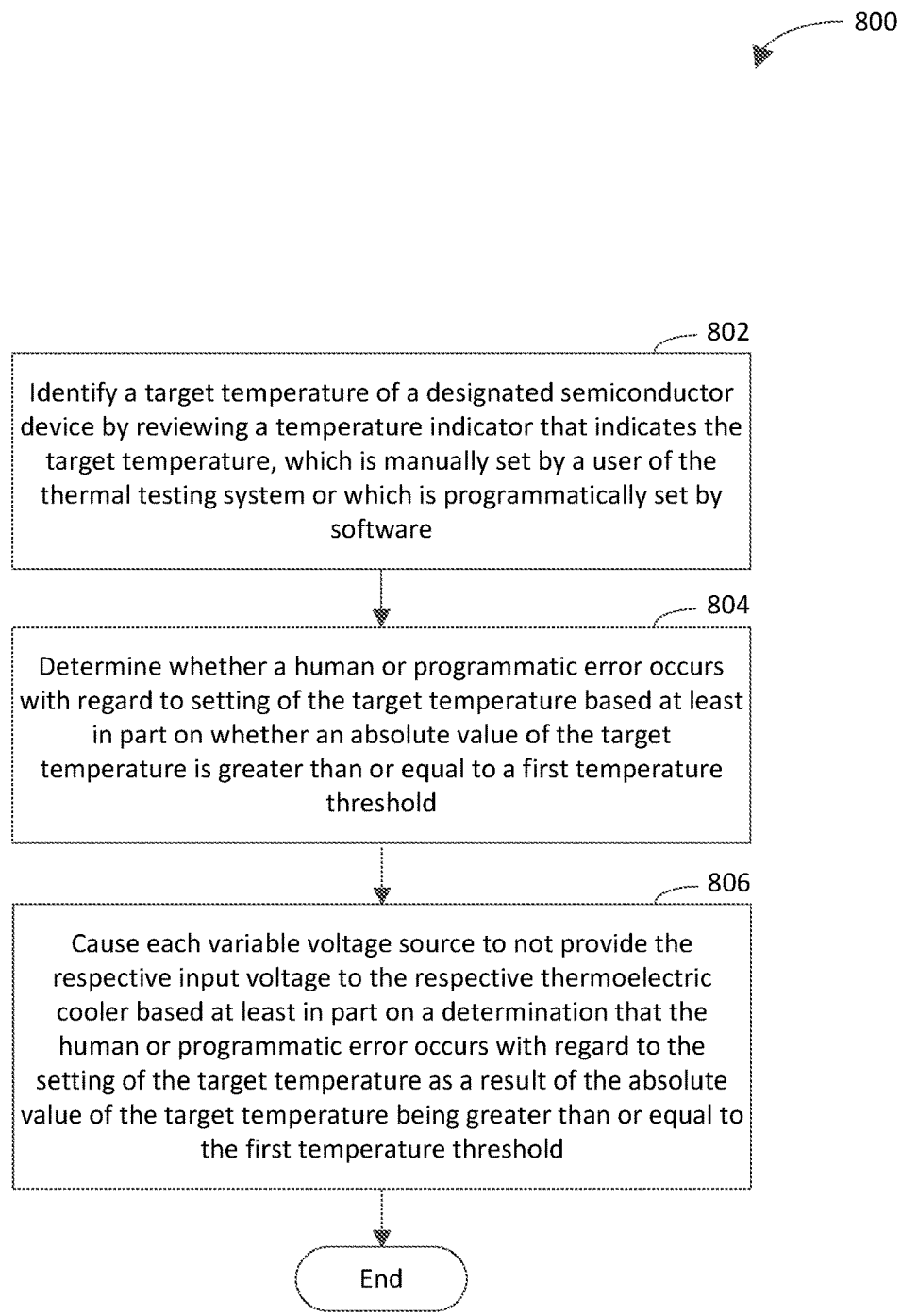

In yet another example embodiment, step 508 in flowchart 500 is replaced with one or more of the steps shown in flowchart 800 of FIG. 8. As shown in FIG. 8, the method of flowchart 800 begins at step 802. In step 802, a target temperature of a designated semiconductor device, which is included among the semiconductor device(s), is identified by reviewing a temperature indicator that indicates the target temperature, which is manually set by a user of the thermal testing system or which is programmatically set by software. In an example implementation, the processing system 250 identifies the target temperature of the designated semiconductor device by reviewing the temperature indicator. The target temperature may have been manually set by a user of the thermal testing system 100 or 200 or may have been programmatically set by software (e.g., that executes on the processing system 250).

At step 804, a determination is made whether a human or programmatic error occurs with regard to setting of the target temperature based at least in part on whether an absolute value of the target temperature is greater than or equal to a first temperature threshold. In an example implementation, the processing system 250 determines whether a human or programmatic error occurs with regard to the setting of the target temperature. For instance, the processing system 250 calculate an absolute value of the target temperature. The processing system may compare the absolute value of the target temperature and the first temperature threshold to determine whether the target temperature is greater than or equal to the first temperature threshold.

At step 806, each variable voltage source is caused to not provide the respective input voltage to the respective thermoelectric cooler based at least in part on a determination that the human or programmatic error occurs with regard to the setting of the target temperature as a result of the absolute value of the target temperature being greater than or equal to the first temperature threshold. In an example implementation, the processing system 250 causes the variable voltage sources 130 to not provide the respective first and second input voltages 110 and 120 to the respective first and second TECs 114 and 124 based at least in part on the determination that the human or programmatic error occurs with regard to the setting of the target temperature.

In an aspect of this embodiment, the method of flowchart 800 further includes generating a first voltage to control a circuit board to which the designated semiconductor device is attached. In an example implementation, the thermal controller 102 generates the first voltage to control the circuit board to which the designated semiconductor device is attached. In accordance with this embodiment, the method of flowchart 800 further includes not providing the first voltage to the circuit board based at least in part on the determination that the human or programmatic error occurs with regard to the setting of the target temperature as a result of the absolute value of the target temperature being greater than or equal to the first temperature threshold. In an example implementation, the thermal controller 102 does not provide the first voltage to the circuit board based at least in part on the determination that the human or programmatic error occurs with regard to the setting of the target temperature.

In an example of this aspect, not providing the first voltage to the circuit board is further based at least in part on the absolute value of the target temperature being greater than or equal to a second temperature threshold that is greater than the first temperature threshold. In accordance with this example, the method of flowchart 800 may further include generating a second voltage to control a fluid pump from which the fluid is received at the one or more first heat exchangers. For instance, the thermal controller 102 may generate the second voltage to control the fluid pump 108. In further accordance with this example, the method of flowchart 800 may further include not providing the second voltage to the fluid pump based at least in part on the determination that the human or programmatic error occurs with regard to the setting of the target temperature as a result of the absolute value of the target temperature being greater than or equal to the first temperature threshold and further based at least in part on the absolute value of the target temperature being greater than or equal to a third temperature threshold that is greater than the second temperature threshold. For instance, the thermal controller 102 may not provide the second voltage to the fluid pump 108 based at least in part on the determination that the human or programmatic error occurs with regard to the setting of the target temperature and further based at least in part on the absolute value of the target temperature being greater than or equal to the third temperature threshold.

In another aspect of this embodiment, the method of flowchart 800 further includes generating an indicator, which indicates that the human or programmatic error has occurred with regard to the setting of the target temperature, based at least in part on the determination that the human or programmatic error occurs with regard to the setting of the target temperature. In an example implementation, the interface 266 generates the indicator. In an example, the indicator may further indicate that the variable voltage sources are to be reset manually to enable the variable voltage sources to provide the respective input voltages to the respective thermoelectric coolers. In another example, the method of flowchart 800 may further include generating a threshold indicator, which indicates the first temperature threshold, based at least in part on the determination that the human or programmatic error occurs with regard to the setting of the target temperature. For instance, the interface 266 may generate the threshold indicator.

In yet another aspect of this embodiment, the method of flowchart 800 further includes performing a thermal testing process with regard to each of the semiconductor device(s) while an absolute value of a temperature of the respective semiconductor device is less than the temperature threshold. In an example implementation, the processing system 250 performs the thermal testing process with regard to each of the first and second semiconductor devices 118 and 128 while an absolute value of a temperature of the respective semiconductor device is less than the temperature threshold. In accordance with this aspect, the method of flowchart 800 further includes discontinuing the performing of the thermal testing process with regard to each of the semiconductor device(s) based at least in part on the absolute value of the temperature of the respective semiconductor device being greater than or equal to the temperature threshold. In an example implementation, the processing system 250 discontinues the performing of the thermal testing process with regard to each of the first and second semiconductor devices 118 and 128 based at least in part on the absolute value of the temperature of the respective semiconductor device being greater than or equal to the temperature threshold.

Figure 9:
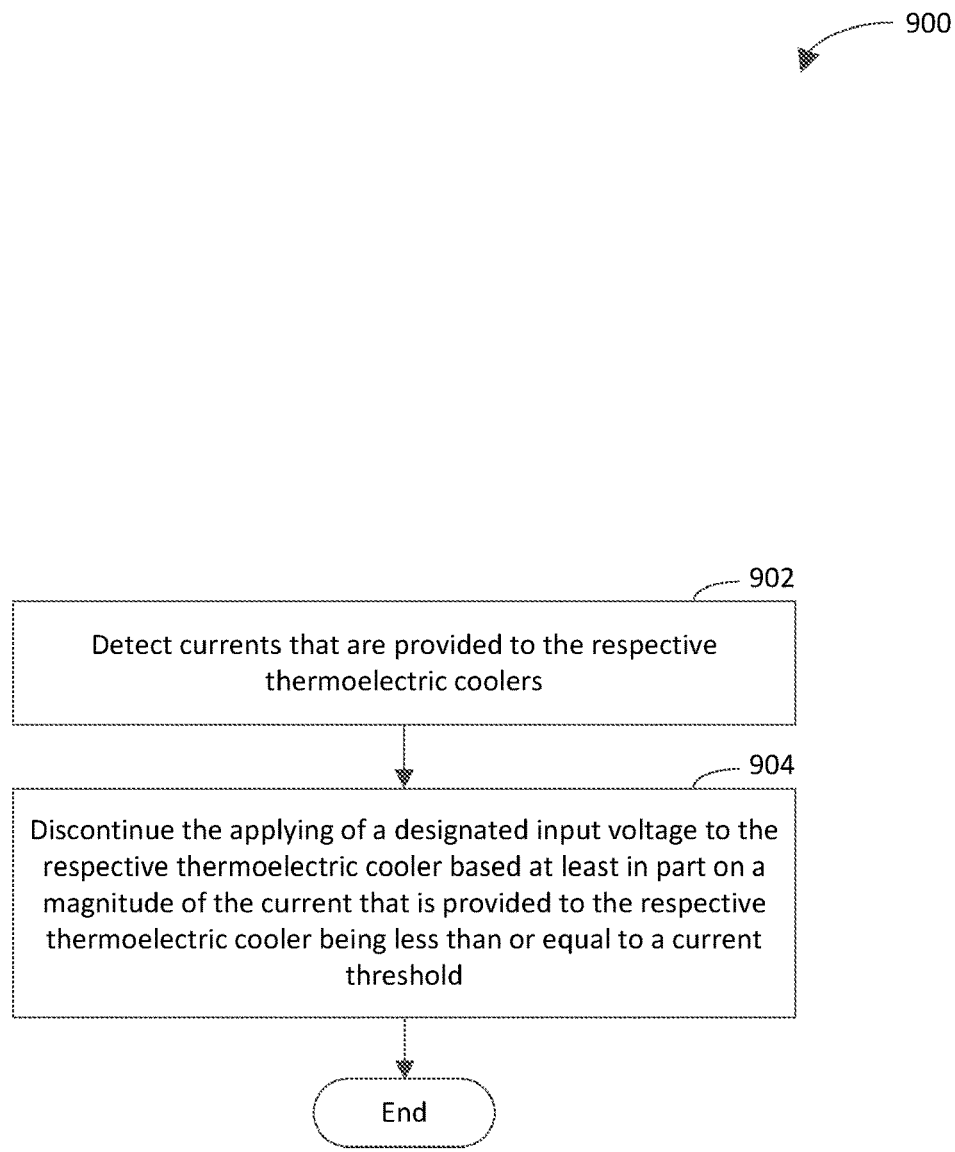

In still another example embodiment, step 508 in flowchart 500 is replaced with one or more of the steps shown in flowchart 900 of FIG. 9. As shown in FIG. 9, the method of flowchart 900 begins at step 902. In step 902, currents that are provided to the respective thermoelectric coolers are detected. In an example implementation, the current sensor 262 detects the currents that are provided to the respective first and second TECs 114 and 124.

At step 904, the applying of a designated input voltage, which is included among the input voltages, to the respective thermoelectric cooler is discontinued based at least in part on a magnitude of the current that is provided to the respective thermoelectric cooler being less than or equal to a current threshold. In an example implementation, a designated variable voltage source, which is included among the variable voltage sources 130, discontinues the applying of the designated input voltage (e.g., first input voltage 110 or second input voltage 120) to the respective TEC (e.g., TEC 114 or TEC 124) based at least in part on a magnitude of the current that is provided to the respective TEC being less than or equal to the current threshold.

In an aspect of this embodiment, the method of flowchart 900 further includes generating a voltage to control a circuit board to which a designated semiconductor device, which is included among the semiconductor device(s), is attached. In an example implementation, the thermal controller 102 generates the voltage to control the circuit board is attached. In accordance with this aspect, the method of flowchart 900 further includes not providing the voltage to the circuit board based at least in part on the magnitude of the current that is provided to the respective thermoelectric cooler being less than or equal to the current threshold. In an example implementation, the thermal controller 102 does not provide the voltage to the circuit board.

In another aspect of this embodiment, the method of flowchart 900 further includes generating a first indicator or a second indicator depending on whether a subset of the currents is modulated. For instance, if each current in the subset is modulated, the first indicator may be generated. If each current in the subset is unmodulated, the second indicator may be generated. In an example implementation, the interface 266 generates the first indicator or the second indicator depending on whether the subset of the currents is modulated.

In yet another aspect of this embodiment, the method of flowchart 900 further includes generating multiple indicators that indicate the respective magnitudes of the respective currents. In an example implementation, the interface 266 generates the indicators.

In still another aspect of this embodiment, the method of flowchart 900 further includes generating an alarm regarding each of the currents that has a magnitude that is less than or equal to the current threshold. In an example implementation, the interface 266 generates the alarm regarding each of the currents that has a magnitude that is less than or equal to the current threshold.

In another aspect of this embodiment, the method of flowchart 900 further includes selecting an alarm from multiple alarms that correspond to respective magnitude ranges based at least in part on the magnitude of the current that is provided to the thermoelectric cooler to which application of the designated input voltage is discontinued being included in the magnitude range to which the selected alarm corresponds. In an example implementation, the processing system 250 selects the alarm from the multiple alarms. In accordance with this aspect, the method of flowchart 900 further includes generating the alarm. In an example implementation, the interface 266 generates the alarm. For instance, the interface 266 may generate the alarm based on receipt of an instruction from the processing system 250 that instructs the interface 266 to generate the alarm. The alarms may be characterized by respective frequencies. For example, the frequency that characterizes each alarm may be different from the frequency that characterizes each other alarm. Each frequency may correspond to a rate at which the respective alarm warbles (e.g., visually or audibly) or pulses (e.g., blinks or chirps). Each frequency may correspond to a color of light that is emitted by the respective alarm or a pitch of a sound that is emitted by the respective alarm.

Although the operations of some of the disclosed methods are described in a particular, sequential order for convenient presentation, it should be understood that this manner of description encompasses rearrangement, unless a particular ordering is required by specific language set forth herein. For example, operations described sequentially may in some cases be rearranged or performed concurrently. Moreover, for the sake of simplicity, the attached figures may not show the various ways in which the disclosed methods may be used in conjunction with other methods.

At least some of the components of each of the thermal testing systems 100, 200, 300, and/or 400, flowchart 500, flowchart 600, flowchart 700, flowchart 800, and/or flowchart 900 may be implemented in hardware, software, firmware, or any combination thereof.

For example, at least some of the components of each of the thermal testing systems 100, 200, 300, and/or 400, flowchart 500, flowchart 600, flowchart 700, flowchart 800, and/or flowchart 900 may be implemented, at least in part, as computer program code configured to be executed in one or more processors.

In another example, at least some of the components of each of the thermal testing systems 100, 200, 300, and/or 400, flowchart 500, flowchart 600, flowchart 700, flowchart 800, and/or flowchart 900 may be implemented, at least in part, as hardware logic/electrical circuitry. Such hardware logic/electrical circuitry may include one or more hardware logic components. Examples of a hardware logic component include but are not limited to a field-programmable gate array (FPGA), an application-specific integrated circuit (ASIC), an application-specific standard product (ASSP), a system-on-a-chip system (SoC), a complex programmable logic device (CPLD), etc. For instance, a SoC may include an integrated circuit chip that includes one or more of a processor (e.g., a microcontroller, microprocessor, digital signal processor (DSP), etc.), memory, one or more communication interfaces, and/or further circuits and/or embedded firmware to perform its functions.

III. Further Discussion of Some Example Embodiments (A1) An example thermal testing system (FIG. 1, 100; FIG. 2, 200; FIG. 3, 300; FIG. 4, 400) comprises a plurality of thermoelectric coolers (FIG. 1, 114, 124; FIG. 2, 214a-214b, 224a-224b, 234a-234b; FIG. 3, 314a-314b; FIG. 4, 414a-414b), a thermal controller (FIG. 1, 102; FIG. 2, 202; FIG. 3, 302; FIG. 4, 402), one or more first heat exchangers (FIG. 1, 112, 122; FIG. 2, 212, 222, 232; FIG. 3, 312; FIG. 4, 412), and one or more second heat exchangers (FIG. 1, 116, 126; FIG. 2, 216, 226, 236; FIG. 3, 316; FIG. 4, 416). Each thermoelectric cooler has first and second opposing surfaces. Each thermoelectric cooler is configured to have a temperature differential between the first and second opposing surfaces of the respective thermoelectric cooler, which is caused by a Peltier effect, based on a respective input voltage (FIG. 1, 110, 120; FIG. 3, 310, 320; FIG. 4, 410, 420). Each subset of a plurality of subsets of the thermoelectric coolers is positioned between a respective first heat exchanger of the one or more first heat exchangers and a respective second heat exchanger of the one or more second heat exchangers. Each subset includes at least one of the plurality of thermoelectric coolers. The thermal controller comprises a plurality of variable voltage sources (FIG. 1, 130, FIG. 2, 230; FIG. 3, 330, FIG. 4, 430) that are configured to control the plurality of respective thermoelectric coolers independently. Each variable voltage source is configured to generate a respective input voltage that corresponds to a respective target temperature differential such that the respective input voltage causes a respective thermoelectric cooler of the plurality of thermoelectric coolers to have the respective target temperature differential between the first and second opposing surfaces of the respective thermoelectric cooler. Each first heat exchanger is configured to transfer heat between a respective subset of the thermoelectric coolers and a fluid (FIG. 1, 152; FIG. 3, 352; FIG. 4, 452). Each second heat exchanger is configured to transfer heat between a respective semiconductor device of a one or more semiconductor devices (FIG. 1, 118, 128; FIG. 2, 218, 228, 238; FIG. 3, 318; FIG. 4, 418) and a respective subset of the thermoelectric coolers. Each variable voltage source is configured to discontinue providing the respective input voltage to the respective thermoelectric cooler based at least in part on a determination that a fluid pump (FIG. 1, 108; FIG. 3, 308; FIG. 4, 408) from which the fluid is received by the one or more first heat exchangers encounters a technical issue.

(A2) In the example thermal testing system of A1, further comprising: a temperature sensor configured to detect a temperature of each second heat exchanger; wherein each variable voltage source is configured to not provide the respective input voltage to the respective thermoelectric cooler based at least in part on the temperature of the second heat exchanger associated with the subset of the thermoelectric coolers that includes the respective thermoelectric cooler, as detected by the temperature sensor, having an absolute value that is greater than or equal to a temperature threshold.

(A3) In the example thermal testing system of any of A1-A2, further comprising: a temperature sensor configured to detect a temperature of a circuit board to which a designated semiconductor device of the one or more semiconductor devices is attached; wherein the thermal controller is configured to conditionally provide power to the circuit board, the thermal controller configured to not provide the power to the circuit board based at least in part on the temperature of the circuit board, as detected by the temperature sensor, having an absolute value that is greater than or equal to a temperature threshold.

(A4) In the example thermal testing system of any of A1-A3, further comprising: the fluid pump configured to pump the fluid to the one or more first heat exchangers; and a temperature sensor configured to detect a temperature of a circuit board to which a designated semiconductor device of the one or more semiconductor devices is attached; wherein the thermal controller is configured to conditionally provide power to the fluid pump, the thermal controller configured to not provide the power to the fluid pump based at least in part on the temperature of the circuit board, as detected by the temperature sensor, having an absolute value that is greater than or equal to a temperature threshold.

(A5) In the example thermal testing system of any of A1-A4, further comprising: a humidity sensor configured to detect a relative humidity in an environment of a designated semiconductor device of the one or more semiconductor devices; wherein each variable voltage source associated with a designated subset of the thermoelectric coolers, which is associated with the designated semiconductor device, is configured to discontinue providing the respective input voltage to the respective thermoelectric cooler in the designated subset based at least in part on the relative humidity, as detected by the humidity sensor, being greater than or equal to a humidity threshold.

(A6) In the example thermal testing system of any of A1-A5, wherein each variable voltage source associated with the designated subset of the thermoelectric coolers is configured to automatically resume providing the respective input voltage to the respective thermoelectric cooler in the designated subset based at least in part on the relative humidity, as detected by the humidity sensor, decreasing below the humidity threshold.

(A7) In the example thermal testing system of any of A1-A6, further comprising: a flow sensor configured to detect a rate at which air flows in a chamber in which a designated semiconductor device of the one or more semiconductor devices is located; wherein each variable voltage source associated with a designated subset of the thermoelectric coolers, which is associated with the designated semiconductor device, is configured to discontinue providing the respective input voltage to the respective thermoelectric cooler in the designated subset based at least in part on the rate at which air flows in the chamber, as detected by the flow sensor, being greater than or equal to a rate threshold.

(A8) In the example thermal testing system of any of A1-A7, wherein the one or more semiconductor devices comprises at least a first semiconductor device and a second semiconductor device that are attached to a common circuit board; and wherein the thermal testing system comprises: a processing system configured to simultaneously test at least the first semiconductor device and the second semiconductor device while a first subset of the plurality of variable voltage sources controls a first subset of the thermoelectric coolers, which is associated with the first semiconductor device, to have a first cumulative target temperature differential across the first subset of the thermoelectric coolers and a second subset of the plurality of variable voltage sources controls a second subset of the thermoelectric coolers, which is associated with the second semiconductor device, to have a second cumulative target temperature differential across the second subset of the thermoelectric coolers that is different from the first cumulative target temperature differential.

(A9) In the example thermal testing system of any of A1-A8, wherein a designated subset of the plurality of variable voltage sources is configured to set a temperature in a chamber in which a designated semiconductor device of the one or more semiconductor devices is located to equal a target temperature by controlling a designated subset of the thermoelectric coolers that is associated with the designated semiconductor device.

(A10) In the example thermal testing system of any of A1-A9, wherein the thermal controller is configured to generate a voltage to control a circuit board to which a designated semiconductor device of the one or more semiconductor devices is attached; and wherein the thermal controller is further configured to not provide the voltage to the circuit board based at least in part on the determination that the fluid pump from which the fluid is received by the one or more first heat exchangers encounters the technical issue.

(A11) In the example thermal testing system of any of A1-A10, further comprising: a flow sensor configured to detect a rate of flow of the fluid that is received at the one or more first heat exchangers from the fluid pump; wherein each variable voltage source is configured to discontinue providing the respective input voltage to the respective thermoelectric cooler based at least in part on the rate of flow of the fluid, as detected by the flow sensor, being less than or equal to a flow threshold; and wherein the technical issue includes the rate of flow of the fluid being less than or equal to the flow threshold.

(A12) In the example thermal testing system of any of A1-A11, further comprising: a flow sensor configured to detect an amount of the fluid that is stored in the fluid pump; wherein each variable voltage source is configured to discontinue providing the respective input voltage to the respective thermoelectric cooler based at least in part on the amount of the fluid that is stored in the fluid pump, as detected by the flow sensor, being less than or equal to an amount threshold; and wherein the technical issue includes the amount of the fluid that is stored in the fluid pump being less than or equal to the amount threshold.

(A13) In the example thermal testing system of any of A1-A12, further comprising: a temperature sensor configured to detect a temperature of the fluid that is received at the one or more first heat exchangers from the fluid pump; wherein each variable voltage source is configured to discontinue providing the respective input voltage to the respective thermoelectric cooler based at least in part on the temperature of the fluid, as detected by the temperature sensor, being greater than or equal to a temperature threshold; and wherein the technical issue includes the temperature of the fluid being greater than or equal to the temperature threshold.

(A14) In the example thermal testing system of any of A1-A13, further comprising: a pressure sensor configured to detect a pressure between a designated second heat exchanger of the one or more second heat exchangers and a designated semiconductor device of the one or more semiconductor devices; wherein each variable voltage source that is configured to control a thermoelectric cooler in the subset of the plurality of thermoelectric coolers that is positioned between a designated first heat exchanger of the one or more first heat exchangers and the designated second heat exchanger is configured to discontinue providing the respective input voltage to the respective thermoelectric cooler based at least in part on the pressure between the designated second heat exchanger and the designated semiconductor device, as detected by the pressure sensor, being less than or equal to a pressure threshold.

(A15) In the example thermal testing system of any of A1-A14, further comprising: a pressure sensor configured to detect a pressure between a designated second heat exchanger of the one or more second heat exchangers and a designated semiconductor device of the one or more semiconductor devices, which is attached to a circuit board; wherein the thermal controller is configured to conditionally provide power to the circuit board, the thermal controller configured to not provide the power to the circuit board based at least in part on the pressure between the designated second heat exchanger and the designated semiconductor device, as detected by the pressure sensor, being less than or equal to a pressure threshold.

(A16) In the example thermal testing system of any of A1-A15, wherein a subset of the plurality of variable voltage sources is configured to modify a temperature of a designated semiconductor device, which is attached to a circuit board and which is included among the one or more semiconductor devices, to equal a target temperature by generating one or more input voltages to control a subset of the thermoelectric coolers that corresponds to the designated semiconductor device without modifying temperatures of other respective semiconductor devices that are attached to the circuit board.

(A17) In the example thermal testing system of any of A1-A16, further comprising: a temperature sensor configured to detect a temperature of a designated second heat exchanger that is included among the one or more second heat exchangers; wherein each variable voltage source that corresponds to a thermoelectric cooler in a subset of the thermoelectric coolers that corresponds to the designated second heat exchanger is configured to not provide the respective input voltage to the respective thermoelectric cooler based at least in part on the temperature of the designated second heat exchanger, as detected by the temperature sensor, having an absolute value that is greater than or equal to a temperature threshold.

(B1) An example thermal testing system (FIG. 1, 100; FIG. 2, 200; FIG. 3, 300; FIG. 4, 400) comprises a plurality of thermoelectric coolers (FIG. 1, 114, 124; FIG. 2, 214a-214b, 224a-224b, 234a-234b; FIG. 3, 314a-314b; FIG. 4, 414a-414b), a thermal controller (FIG. 1, 102; FIG. 2, 202; FIG. 3, 302; FIG. 4, 402), one or more first heat exchangers (FIG. 1, 112, 122; FIG. 2, 212, 222, 232; FIG. 3, 312; FIG. 4, 412), one or more second heat exchangers (FIG. 1, 116, 126; FIG. 2, 216, 226, 236; FIG. 3, 316; FIG. 4, 416), and a processing system (FIG. 2, 250; FIG. 4, 450). Each thermoelectric cooler has first and second opposing surfaces. Each thermoelectric cooler is configured to have a temperature differential between the first and second opposing surfaces of the respective thermoelectric cooler, which is caused by a Peltier effect, based on a respective input voltage (FIG. 1, 110, 120; FIG. 3, 310, 320; FIG. 4, 410, 420). Each subset of a plurality of subsets of the thermoelectric coolers is positioned between a respective first heat exchanger of the one or more first heat exchangers and a respective second heat exchanger of the one or more second heat exchangers. Each subset includes at least one of the plurality of thermoelectric coolers. The thermal controller comprises a plurality of variable voltage sources (FIG. 1, 130, FIG. 2, 230; FIG. 3, 330, FIG. 4, 430) that are configured to control the plurality of respective thermoelectric coolers independently. Each variable voltage source is configured to generate a respective input voltage that corresponds to a respective target temperature differential such that the respective input voltage causes a respective thermoelectric cooler of the plurality of thermoelectric coolers to have the respective target temperature differential between the first and second opposing surfaces of the respective thermoelectric cooler. Each first heat exchanger is configured to transfer heat between a respective subset of the thermoelectric coolers and a fluid (FIG. 1, 152; FIG. 3, 352; FIG. 4, 452). Each second heat exchanger is configured to transfer heat between a respective semiconductor device of a one or more semiconductor devices (FIG. 1, 118, 128; FIG. 2, 218, 228, 238; FIG. 3, 318; FIG. 4, 418) and a respective subset of the thermoelectric coolers. The processing system is configured to identify a target temperature of a designated semiconductor device of the one or more semiconductor devices by reviewing a temperature indicator that indicates the target temperature, which is manually set by a user of the thermal testing system or which is programmatically set by software. The processing system is further configured to determine whether a human or programmatic error occurs with regard to setting of the target temperature based at least in part on whether an absolute value of the target temperature is greater than or equal to a first temperature threshold. The processing system is further configured to cause each variable voltage source of the plurality of variable voltage sources to not provide the respective input voltage to the respective thermoelectric cooler based at least in part on a determination that the human or programmatic error occurs with regard to the setting of the target temperature as a result of the absolute value of the target temperature being greater than or equal to the first temperature threshold.

(B2) In the example thermal testing system of B1, further comprising: a temperature sensor configured to detect a temperature of each second heat exchanger; wherein each variable voltage source is configured to not provide the respective input voltage to the respective thermoelectric cooler based at least in part on the temperature of the second heat exchanger associated with the subset of the thermoelectric coolers that includes the respective thermoelectric cooler, as detected by the temperature sensor, having an absolute value that is greater than or equal to a temperature threshold.

(B3) In the example thermal testing system of any of B1-B2, further comprising: a temperature sensor configured to detect a temperature of a circuit board to which a designated semiconductor device of the one or more semiconductor devices is attached; wherein the thermal controller is configured to conditionally provide power to the circuit board, the thermal controller configured to not provide the power to the circuit board based at least in part on the temperature of the circuit board, as detected by the temperature sensor, having an absolute value that is greater than or equal to a temperature threshold.

(B4) In the example thermal testing system of any of B1-B3, further comprising: a fluid pump configured to pump the fluid to the one or more first heat exchangers; and a temperature sensor configured to detect a temperature of a circuit board to which a designated semiconductor device of the one or more semiconductor devices is attached; wherein the thermal controller is configured to conditionally provide power to the fluid pump, the thermal controller configured to not provide the power to the fluid pump based at least in part on the temperature of the circuit board, as detected by the temperature sensor, having an absolute value that is greater than or equal to a temperature threshold.

(B5) In the example thermal testing system of any of B1-B4, further comprising: a humidity sensor configured to detect a relative humidity in an environment of a designated semiconductor device of the one or more semiconductor devices; wherein each variable voltage source associated with a designated subset of the thermoelectric coolers, which is associated with the designated semiconductor device, is configured to discontinue providing the respective input voltage to the respective thermoelectric cooler in the designated subset based at least in part on the relative humidity, as detected by the humidity sensor, being greater than or equal to a humidity threshold.

(B6) In the example thermal testing system of any of B1-B5, wherein each variable voltage source associated with the designated subset of the thermoelectric coolers is configured to automatically resume providing the respective input voltage to the respective thermoelectric cooler in the designated subset based at least in part on the relative humidity, as detected by the humidity sensor, decreasing below the humidity threshold.

(B7) In the example thermal testing system of any of B1-B6, further comprising: a flow sensor configured to detect a rate at which air flows in a chamber in which a designated semiconductor device of the one or more semiconductor devices is located; wherein each variable voltage source associated with a designated subset of the thermoelectric coolers, which is associated with the designated semiconductor device, is configured to discontinue providing the respective input voltage to the respective thermoelectric cooler in the designated subset based at least in part on the rate at which air flows in the chamber, as detected by the flow sensor, being greater than or equal to a rate threshold.

(B8) In the example thermal testing system of any of B1-B7, wherein the one or more semiconductor devices comprises at least a first semiconductor device and a second semiconductor device that are attached to a common circuit board; and wherein the processing system is further configured to simultaneously test at least the first semiconductor device and the second semiconductor device while a first subset of the plurality of variable voltage sources controls a first subset of the thermoelectric coolers, which is associated with the first semiconductor device, to have a first cumulative target temperature differential across the first subset of the thermoelectric coolers and a second subset of the plurality of variable voltage sources controls a second subset of the thermoelectric coolers, which is associated with the second semiconductor device, to have a second cumulative target temperature differential across the second subset of the thermoelectric coolers that is different from the first cumulative target temperature differential.

(B9) In the example thermal testing system of any of B1-B8, wherein a designated subset of the plurality of variable voltage sources is configured to set a temperature in a chamber in which a designated semiconductor device of the one or more semiconductor devices is located to equal a target temperature by controlling a designated subset of the thermoelectric coolers that is associated with the designated semiconductor device.

(B10) In the example thermal testing system of any of B1-B9, wherein the thermal controller is configured to generate a voltage to control a circuit board to which the designated semiconductor device is attached; and wherein the thermal controller is further configured to not provide the voltage to the circuit board based at least in part on the determination that the human or programmatic error occurs with regard to the setting of the target temperature as a result of the absolute value of the target temperature being greater than or equal to the first temperature threshold.

(B11) In the example thermal testing system of any of B1-B10, wherein the thermal controller is configured to not provide the voltage to the circuit board further based at least in part on the absolute value of the target temperature being greater than or equal to a second temperature threshold that is greater than the first temperature threshold.

(B12) In the example thermal testing system of any of B1-B11, wherein the thermal controller is configured to generate a voltage to control a fluid pump from which the fluid is received by the one or more first heat exchangers; and wherein the thermal controller is further configured to not provide the voltage to the fluid pump based at least in part on the determination that the human or programmatic error occurs with regard to the setting of the target temperature as a result of the absolute value of the target temperature being greater than or equal to the first temperature threshold and further based at least in part on the absolute value of the target temperature being greater than or equal to a third temperature threshold that is greater than the second temperature threshold.

(B13) In the example thermal testing system of any of B1-B12, further comprising: an interface configured to generate an indicator, which indicates that the human or programmatic error has occurred with regard to the setting of the target temperature, based at least in part on the determination that the human or programmatic error occurs with regard to the setting of the target temperature.

(B14) In the example thermal testing system of any of B1-B13, wherein the indicator further indicates that the plurality of variable voltage sources is to be reset manually to enable the plurality of variable voltage sources to provide the respective input voltages to the plurality of respective thermoelectric coolers.

(B15) In the example thermal testing system of any of B1-B14, wherein the interface is further configured to generate a threshold indicator, which indicates the first temperature threshold, based at least in part on the determination that the human or programmatic error occurs with regard to the setting of the target temperature.

(B16) In the example thermal testing system of any of B1-B15, wherein the processing system is further configured to perform a thermal testing process with regard to each of the one or more semiconductor devices while an absolute value of a temperature of the respective semiconductor device is less than the temperature threshold; and wherein the processing system is further configured to discontinue performance of the thermal testing process with regard to each of the one or more semiconductor devices based at least in part on the absolute value of the temperature of the respective semiconductor device being greater than or equal to the temperature threshold.

(B17) In the example thermal testing system of any of B1-B16, wherein a subset of the plurality of variable voltage sources is configured to modify a temperature of a designated semiconductor device, which is attached to a circuit board and which is included among the one or more semiconductor devices, to equal a target temperature by generating one or more input voltages to control a subset of the thermoelectric coolers that corresponds to the designated semiconductor device without modifying temperatures of other respective semiconductor devices that are attached to the circuit board.

(B18) In the example thermal testing system of any of B1-B17, further comprising: a temperature sensor configured to detect a temperature of a designated second heat exchanger that is included among the one or more second heat exchangers; wherein each variable voltage source that corresponds to a thermoelectric cooler in a subset of the thermoelectric coolers that corresponds to the designated second heat exchanger is configured to not provide the respective input voltage to the respective thermoelectric cooler based at least in part on the temperature of the designated second heat exchanger, as detected by the temperature sensor, having an absolute value that is greater than or equal to a temperature threshold.

(C1) An example thermal testing system (FIG. 1, 100; FIG. 2, 200; FIG. 3, 300; FIG. 4, 400) comprises a plurality of thermoelectric coolers (FIG. 1, 114, 124; FIG. 2, 214a-214b, 224a-224b, 234a-234b; FIG. 3, 314a-314b; FIG. 4, 414a-414b), a thermal controller (FIG. 1, 102; FIG. 2, 202; FIG. 3, 302; FIG. 4, 402), one or more first heat exchangers (FIG. 1, 112, 122; FIG. 2, 212, 222, 232; FIG. 3, 312; FIG. 4, 412), one or more second heat exchangers (FIG. 1, 116, 126; FIG. 2, 216, 226, 236; FIG. 3, 316; FIG. 4, 416), and a current sensor (FIG. 2, 262; FIG. 4, 462). Each thermoelectric cooler has first and second opposing surfaces. Each thermoelectric cooler is configured to have a temperature differential between the first and second opposing surfaces of the respective thermoelectric cooler, which is caused by a Peltier effect, based on a respective input voltage (FIG. 1, 110, 120; FIG. 3, 310, 320; FIG. 4, 410, 420). Each subset of a plurality of subsets of the thermoelectric coolers is positioned between a respective first heat exchanger of the one or more first heat exchangers and a respective second heat exchanger of the one or more second heat exchangers. Each subset includes at least one of the plurality of thermoelectric coolers. The thermal controller comprises a plurality of variable voltage sources (FIG. 1, 130, FIG. 2, 230; FIG. 3, 330, FIG. 4, 430) that are configured to control the plurality of respective thermoelectric coolers independently. Each variable voltage source is configured to generate a respective input voltage that corresponds to a respective target temperature differential such that the respective input voltage causes a respective thermoelectric cooler of the plurality of thermoelectric coolers to have the respective target temperature differential between the first and second opposing surfaces of the respective thermoelectric cooler. Each first heat exchanger is configured to transfer heat between a respective subset of the thermoelectric coolers and a fluid (FIG. 1, 152; FIG. 3, 352; FIG. 4, 452). Each second heat exchanger is configured to transfer heat between a respective semiconductor device of a one or more semiconductor devices (FIG. 1, 118, 128; FIG. 2, 218, 228, 238; FIG. 3, 318; FIG. 4, 418) and a respective subset of the thermoelectric coolers. The current sensor is configured to detect a plurality of currents that are provided to the plurality of respective thermoelectric coolers. Each variable voltage source is configured to discontinue providing the respective input voltage to the respective thermoelectric cooler based at least in part on a magnitude of the current that is provided to the respective thermoelectric cooler, as detected by the current sensor, being less than or equal to a current threshold.

(C2) In the example thermal testing system of C1, further comprising: a temperature sensor configured to detect a temperature of each second heat exchanger; wherein each variable voltage source is configured to not provide the respective input voltage to the respective thermoelectric cooler based at least in part on the temperature of the second heat exchanger associated with the subset of the thermoelectric coolers that includes the respective thermoelectric cooler, as detected by the temperature sensor, having an absolute value that is greater than or equal to a temperature threshold.

(C3) In the example thermal testing system of any of C1-C2, further comprising: a temperature sensor configured to detect a temperature of a circuit board to which a designated semiconductor device of the one or more semiconductor devices is attached; wherein the thermal controller is configured to conditionally provide power to the circuit board, the thermal controller configured to not provide the power to the circuit board based at least in part on the temperature of the circuit board, as detected by the temperature sensor, having an absolute value that is greater than or equal to a temperature threshold.

(C4) In the example thermal testing system of any of C1-C3, further comprising: a fluid pump configured to pump the fluid to the one or more first heat exchangers; and a temperature sensor configured to detect a temperature of a circuit board to which a designated semiconductor device of the one or more semiconductor devices is attached; wherein the thermal controller is configured to conditionally provide power to the fluid pump, the thermal controller configured to not provide the power to the fluid pump based at least in part on the temperature of the circuit board, as detected by the temperature sensor, having an absolute value that is greater than or equal to a temperature threshold.

(C5) In the example thermal testing system of any of C1-C4, further comprising: a humidity sensor configured to detect a relative humidity in an environment of a designated semiconductor device of the one or more semiconductor devices; wherein each variable voltage source associated with a designated subset of the thermoelectric coolers, which is associated with the designated semiconductor device, is configured to discontinue providing the respective input voltage to the respective thermoelectric cooler in the designated subset based at least in part on the relative humidity, as detected by the humidity sensor, being greater than or equal to a humidity threshold.

(C6) In the example thermal testing system of any of C1-C5, wherein each variable voltage source associated with the designated subset of the thermoelectric coolers is configured to automatically resume providing the respective input voltage to the respective thermoelectric cooler in the designated subset based at least in part on the relative humidity, as detected by the humidity sensor, decreasing below the humidity threshold.

(C7) In the example thermal testing system of any of C1-C6, further comprising: a flow sensor configured to detect a rate at which air flows in a chamber in which a designated semiconductor device of the one or more semiconductor devices is located; wherein each variable voltage source associated with a designated subset of the thermoelectric coolers, which is associated with the designated semiconductor device, is configured to discontinue providing the respective input voltage to the respective thermoelectric cooler in the designated subset based at least in part on the rate at which air flows in the chamber, as detected by the flow sensor, being greater than or equal to a rate threshold.

(C8) In the example thermal testing system of any of C1-C7, wherein the one or more semiconductor devices comprises at least a first semiconductor device and a second semiconductor device that are attached to a common circuit board; and wherein the thermal testing system comprises: a processing system configured to simultaneously test at least the first semiconductor device and the second semiconductor device while a first subset of the plurality of variable voltage sources controls a first subset of the thermoelectric coolers, which is associated with the first semiconductor device, to have a first cumulative target temperature differential across the first subset of the thermoelectric coolers and a second subset of the plurality of variable voltage sources controls a second subset of the thermoelectric coolers, which is associated with the second semiconductor device, to have a second cumulative target temperature differential across the second subset of the thermoelectric coolers that is different from the first cumulative target temperature differential.

(C9) In the example thermal testing system of any of C1-C8, wherein a designated subset of the plurality of variable voltage sources is configured to set a temperature in a chamber in which a designated semiconductor device of the one or more semiconductor devices is located to equal a target temperature by controlling a designated subset of the thermoelectric coolers that is associated with the designated semiconductor device.

(C10) In the example thermal testing system of any of C1-C9, wherein the thermal controller is configured to generate a voltage to control a circuit board to which a designated semiconductor device of the one or more semiconductor devices is attached; and wherein the thermal controller is further configured to not provide the voltage to the circuit board based at least in part on the magnitude of the current that is provided to the respective thermoelectric cooler, as detected by the current sensor, being less than or equal to the current threshold.

(C11) In the example thermal testing system of any of C1-C10, further comprising: an interface configured to generate a first indicator or a second indicator depending on whether at least one current of the plurality of currents is modulated, the interface configured to generate the first indicator based on the at least one current being modulated, the interface configured to generate the second indicator based on the at least one current being unmodulated.

(C12) In the example thermal testing system of any of C1-C11, further comprising: an interface configured to generate a plurality of indicators that indicate the respective magnitudes of the plurality of respective currents.

(C13) In the example thermal testing system of any of C1-C12, further comprising: an interface configured to generate an alarm regarding each current of the plurality of currents that has a magnitude, as detected by the current sensor, that is less than or equal to the current threshold.

(C14) In the example thermal testing system of any of C1-C13, further comprising: an interface configured to generate a plurality of alarms related to a plurality of respective current thresholds, the interface configured to generate each alarm of the plurality of alarms based at least in part on a magnitude of a current of the plurality of currents, as detected by the current sensor, being less than or equal to a respective current threshold of the plurality of current thresholds.

(C15) In the example thermal testing system of any of C1-C14, wherein a subset of the plurality of variable voltage sources is configured to modify a temperature of a designated semiconductor device, which is attached to a circuit board and which is included among the one or more semiconductor devices, to equal a target temperature by generating one or more input voltages to control a subset of the thermoelectric coolers that corresponds to the designated semiconductor device without modifying temperatures of other respective semiconductor devices that are attached to the circuit board.

(C16) In the example thermal testing system of any of C1-C15, further comprising: a temperature sensor configured to detect a temperature of a designated second heat exchanger that is included among the one or more second heat exchangers; wherein each variable voltage source that corresponds to a thermoelectric cooler in a subset of the thermoelectric coolers that corresponds to the designated second heat exchanger is configured to not provide the respective input voltage to the respective thermoelectric cooler based at least in part on the temperature of the designated second heat exchanger, as detected by the temperature sensor, having an absolute value that is greater than or equal to a temperature threshold.

(D1) An example method of setting one or more temperatures of one or more respective semiconductor devices (FIG. 1, 118, 128; FIG. 2, 218, 228, 238; FIG. 3, 318; FIG. 4, 418) in a thermal testing environment comprises controlling (FIG. 5, 502) a plurality of thermoelectric coolers (FIG. 1, 114, 124; FIG. 2, 214a-214b, 224a-224b, 234a-234b; FIG. 3, 314a-314b; FIG. 4, 414a-414b) independently using a plurality of respective variable voltage sources (FIG. 1, 130; FIG. 2, 230; FIG. 3, 330; FIG. 4, 430). The controlling comprises creating (FIG. 5, 510) a plurality of temperature differentials between first and second opposing surfaces of the plurality of respective thermoelectric coolers in accordance with a Peltier effect by applying a plurality of respective input voltages (FIG. 1, 110, 120; FIG. 3, 310, 320; FIG. 4, 410, 420) to the plurality of respective thermoelectric coolers. The method further comprises transferring (FIG. 5, 504), using each of one or more first heat exchangers (FIG. 1, 112, 122; FIG. 2, 212, 222, 232; FIG. 3, 312; FIG. 4, 412), heat between a fluid (FIG. 1, 152; FIG. 3, 352; FIG. 4, 452) and a respective subset of the thermoelectric coolers that is positioned between the respective first heat exchanger and a respective second heat exchanger of one or more second heat exchangers (FIG. 1, 116, 126; FIG. 2, 216, 226, 236; FIG. 3, 316; FIG. 4, 416). Each subset includes at least one of the plurality of thermoelectric coolers. The method further comprises transferring (FIG. 5, 506), using each of the one or more second heat exchangers, heat between the a respective semiconductor device of the one or more semiconductor devices and the respective subset of the thermoelectric coolers. The method further comprises discontinuing (FIG. 5, 508) the applying of each input voltage to the respective thermoelectric cooler based at least in part on a determination that a fluid pump (FIG. 1, 108; FIG. 3, 308; FIG. 4, 408) from which the fluid is received at the one or more first heat exchangers encounters a technical issue.

(D2) In the method of D1, further comprising: detecting, using a temperature sensor, a temperature of a designated second heat exchanger of the one or more second heat exchangers; and delaying, using each variable voltage source in a designated subset of the variable voltage sources that controls a designated subset of the thermoelectric coolers associated with the designated second heat exchanger, providing the respective input voltage to the respective thermoelectric cooler until a manual reset of the respective variable voltage source is performed, based at least in part on the temperature of the designated second heat exchanger, as detected using the temperature sensor, having an absolute value that is greater than or equal to a temperature threshold.

(D3) In the method of any of D1-D2, further comprising: detecting, using a temperature sensor, a temperature of a circuit board to which a designated semiconductor device of the one or more semiconductor devices is attached; conditionally providing, using the thermal controller, power to the circuit board, the conditionally providing including not providing the power to the circuit board based at least in part on the temperature of the circuit board, as detected using the temperature sensor, having an absolute value that is greater than or equal to a temperature threshold.

(D4) In the method of any of D1-D3, further comprising: pumping, using the fluid pump, the fluid to the one or more first heat exchangers; detecting, using a temperature sensor, a temperature of a circuit board to which a designated semiconductor device of the one or more semiconductor devices is attached; and conditionally providing, using the thermal controller, power to the fluid pump, the conditionally providing including not providing the power to the fluid pump based at least in part on the temperature of the circuit board, as detected using the temperature sensor, having an absolute value that is greater than or equal to a temperature threshold.

(D5) In the method of any of D1-D4, further comprising: detecting, using a humidity sensor, a relative humidity in an environment of a designated semiconductor device of the one or more semiconductor devices; and discontinuing, using each variable voltage source associated with a designated subset of the thermoelectric coolers that is associated with the designated semiconductor device, providing the respective input voltage to the respective thermoelectric cooler in the designated subset based at least in part on the relative humidity, as detected using the humidity sensor, being greater than or equal to a humidity threshold.

(D6) In the method of any of D1-D5, further comprising: automatically resuming, using each variable voltage source associated with the designated subset of the thermoelectric coolers, providing the respective input voltage to the respective thermoelectric cooler in the designated subset based at least in part on the relative humidity, as detected using the humidity sensor, decreasing below the humidity threshold.

(D7) In the method of any of D1-D6, further comprising: detecting, using a flow sensor, a rate at which air flows in a chamber in which a designated semiconductor device of the one or more semiconductor devices is located; and discontinuing, using each variable voltage source associated with a designated subset of the thermoelectric coolers that is associated with the designated semiconductor device, providing the respective input voltage to the respective thermoelectric cooler in the designated subset based at least in part on the rate at which air flows in the chamber, as detected using the flow sensor, being greater than or equal to a rate threshold.

(D8) In the method of any of D1-D7, wherein the one or more semiconductor devices comprise at least a first semiconductor device and a second semiconductor device that are attached to a common circuit board; and wherein the method further comprises: simultaneously testing, using a processing system, at least the first semiconductor device and the second semiconductor device while a first subset of the plurality of variable voltage sources controls a first subset of the thermoelectric coolers, which is associated with the first semiconductor device, to have a first cumulative target temperature differential across the first subset of the thermoelectric coolers and a second subset of the plurality of variable voltage sources controls a second subset of the thermoelectric coolers, which is associated with the second semiconductor device, to have a second cumulative target temperature differential across the second subset of the thermoelectric coolers that is different from the first cumulative target temperature differential.

(D9) In the method of any of D1-D8, wherein controlling the plurality of thermoelectric coolers independently comprises: setting, using a designated subset of the plurality of variable voltage sources, a temperature in a chamber in which a designated semiconductor device of the one or more semiconductor devices is located to equal a target temperature by controlling a designated subset of the thermoelectric coolers that is associated with the designated semiconductor device.

(D10) In the method of any of D1-D9, further comprising: generating a voltage to control a circuit board to which a designated semiconductor device of the one or more semiconductor devices is attached; and not providing the voltage to the circuit board based at least in part on the determination that the fluid pump from which the fluid is received at the one or more first heat exchangers encounters the technical issue.

(D11) In the method of any of D1-D10, further comprising: detecting a rate of flow of the fluid that is received at the one or more first heat exchangers from the fluid pump; and discontinuing the applying of each input voltage to the respective thermoelectric cooler based at least in part on the rate of flow of the fluid being less than or equal to a flow threshold; wherein the technical issue includes the rate of flow of the fluid being less than or equal to the flow threshold.

(D12) In the method of any of D1-D11, further comprising: detecting an amount of the fluid that is stored in the fluid pump; and discontinuing the applying of each input voltage to the respective thermoelectric cooler based at least in part on the amount of the fluid that is stored in the fluid pump being less than or equal to an amount threshold; wherein the technical issue includes the amount of the fluid that is stored in the fluid pump being less than or equal to the amount threshold.

(D13) In the method of any of D1-D12, further comprising: detecting a temperature of the fluid that is received at the one or more first heat exchangers from the fluid pump; and discontinuing the applying of each input voltage to the respective thermoelectric cooler based at least in part on the temperature of the fluid being greater than or equal to a temperature threshold; wherein the technical issue includes the temperature of the fluid being greater than or equal to the temperature threshold.

(E1) An example method of setting one or more temperatures of one or more respective semiconductor devices (FIG. 1, 118, 128; FIG. 2, 218, 228, 238; FIG. 3, 318; FIG. 4, 418) in a thermal testing environment comprises controlling (FIG. 5, 502) a plurality of thermoelectric coolers (FIG. 1, 114, 124; FIG. 2, 214a-214b, 224a-224b, 234a-234b; FIG. 3, 314a-314b; FIG. 4, 414a-414b) independently using a plurality of respective variable voltage sources (FIG. 1, 130; FIG. 2, 230; FIG. 3, 330; FIG. 4, 430). The controlling comprises creating (FIG. 5, 510) a plurality of temperature differentials between first and second opposing surfaces of the plurality of respective thermoelectric coolers in accordance with a Peltier effect by applying a plurality of respective input voltages (FIG. 1, 110, 120; FIG. 3, 310, 320; FIG. 4, 410, 420) to the plurality of respective thermoelectric coolers. The method further comprises transferring (FIG. 5, 504), using each of one or more first heat exchangers (FIG. 1, 112, 122; FIG. 2, 212, 222, 232; FIG. 3, 312; FIG. 4, 412), heat between a fluid (FIG. 1, 152; FIG. 3, 352; FIG. 4, 452) and a respective subset of the thermoelectric coolers that is positioned between the respective first heat exchanger and a respective second heat exchanger of one or more second heat exchangers (FIG. 1, 116, 126; FIG. 2, 216, 226, 236; FIG. 3, 316; FIG. 4, 416). Each subset includes at least one of the plurality of thermoelectric coolers. The method further comprises transferring (FIG. 5, 506), using each of the one or more second heat exchangers, heat between the a respective semiconductor device of the one or more semiconductor devices and the respective subset of the thermoelectric coolers. The method further comprises identifying (FIG. 8, 802) a target temperature of a designated semiconductor device of the one or more semiconductor devices by reviewing a temperature indicator that indicates the target temperature, which is manually set by a user of the thermal testing system or which is programmatically set by software. The method further comprises determining (FIG. 8, 804) whether a human or programmatic error occurs with regard to setting of the target temperature based at least in part on whether an absolute value of the target temperature is greater than or equal to a first temperature threshold. The method further comprises causing (FIG. 8, 806) each variable voltage source to not provide the respective input voltage to the respective thermoelectric cooler based at least in part on determining that the human or programmatic error occurs with regard to the setting of the target temperature as a result of the absolute value of the target temperature being greater than or equal to the first temperature threshold.

(E2) In the method of E1, further comprising: detecting, using a temperature sensor, a temperature of a designated second heat exchanger of the one or more second heat exchangers; and delaying, using each variable voltage source in a designated subset of the variable voltage sources that controls a designated subset of the thermoelectric coolers associated with the designated second heat exchanger, providing the respective input voltage to the respective thermoelectric cooler until a manual reset of the respective variable voltage source is performed, based at least in part on the temperature of the designated second heat exchanger, as detected using the temperature sensor, having an absolute value that is greater than or equal to a temperature threshold.

(E3) In the method of any of E1-E2, further comprising: detecting, using a temperature sensor, a temperature of a circuit board to which a designated semiconductor device of the one or more semiconductor devices is attached; conditionally providing, using the thermal controller, power to the circuit board, the conditionally providing including not providing the power to the circuit board based at least in part on the temperature of the circuit board, as detected using the temperature sensor, having an absolute value that is greater than or equal to a temperature threshold.

(E4) In the method of any of E1-E3, further comprising: pumping, using a fluid pump, the fluid to the one or more first heat exchangers; detecting, using a temperature sensor, a temperature of a circuit board to which a designated semiconductor device of the one or more semiconductor devices is attached; and conditionally providing, using the thermal controller, power to the fluid pump, the conditionally providing including not providing the power to the fluid pump based at least in part on the temperature of the circuit board, as detected using the temperature sensor, having an absolute value that is greater than or equal to a temperature threshold.

(E5) In the method of any of E1-E4, further comprising: detecting, using a humidity sensor, a relative humidity in an environment of a designated semiconductor device of the one or more semiconductor devices; and discontinuing, using each variable voltage source associated with a designated subset of the thermoelectric coolers that is associated with the designated semiconductor device, providing the respective input voltage to the respective thermoelectric cooler in the designated subset based at least in part on the relative humidity, as detected using the humidity sensor, being greater than or equal to a humidity threshold.

(E6) In the method of any of E1-E5, further comprising: automatically resuming, using each variable voltage source associated with the designated subset of the thermoelectric coolers, providing the respective input voltage to the respective thermoelectric cooler in the designated subset based at least in part on the relative humidity, as detected using the humidity sensor, decreasing below the humidity threshold.

(E7) In the method of any of E1-E6, further comprising: detecting, using a flow sensor, a rate at which air flows in a chamber in which a designated semiconductor device of the one or more semiconductor devices is located; and discontinuing, using each variable voltage source associated with a designated subset of the thermoelectric coolers that is associated with the designated semiconductor device, providing the respective input voltage to the respective thermoelectric cooler in the designated subset based at least in part on the rate at which air flows in the chamber, as detected using the flow sensor, being greater than or equal to a rate threshold.

(E8) In the method of any of E1-E7, wherein the one or more semiconductor devices comprise at least a first semiconductor device and a second semiconductor device that are attached to a common circuit board; and wherein the method further comprises: simultaneously testing, using a processing system, at least the first semiconductor device and the second semiconductor device while a first subset of the plurality of variable voltage sources controls a first subset of the thermoelectric coolers, which is associated with the first semiconductor device, to have a first cumulative target temperature differential across the first subset of the thermoelectric coolers and a second subset of the plurality of variable voltage sources controls a second subset of the thermoelectric coolers, which is associated with the second semiconductor device, to have a second cumulative target temperature differential across the second subset of the thermoelectric coolers that is different from the first cumulative target temperature differential.

(E9) In the method of any of E1-E8, wherein controlling the plurality of thermoelectric coolers independently comprises: setting, using a designated subset of the plurality of variable voltage sources, a temperature in a chamber in which a designated semiconductor device of the one or more semiconductor devices is located to equal a target temperature by controlling a designated subset of the thermoelectric coolers that is associated with the designated semiconductor device.

(E10) In the method of any of E1-E9, further comprising: generating a first voltage to control a circuit board to which the designated semiconductor device is attached; and not providing the first voltage to the circuit board based at least in part on determining that the human or programmatic error occurs with regard to the setting of the target temperature as a result of the absolute value of the target temperature being greater than or equal to the first temperature threshold.

(E11) In the method of any of E1-E10, wherein not providing the first voltage to the circuit board comprises: not providing the first voltage to the circuit board further based at least in part on the absolute value of the target temperature being greater than or equal to a second temperature threshold that is greater than the first temperature threshold.

(E12) In the method of any of E1-E11, further comprising: generating a second voltage to control a fluid pump from which the fluid is received at the one or more first heat exchangers; and not providing the second voltage to the fluid pump based at least in part on determining that the human or programmatic error occurs with regard to the setting of the target temperature as a result of the absolute value of the target temperature being greater than or equal to the first temperature threshold and further based at least in part on the absolute value of the target temperature being greater than or equal to a third temperature threshold that is greater than the second temperature threshold.

(E13) In the method of any of E1-E12, further comprising: generating an indicator, which indicates that the human or programmatic error has occurred with regard to the setting of the target temperature, based at least in part on determining that the human or programmatic error occurs with regard to the setting of the target temperature.

(E14) In the method of any of E1-E13, wherein generating the indicator comprises: generating the indicator, which further indicates that the plurality of variable voltage sources is to be reset manually to enable the plurality of variable voltage sources to provide the respective input voltages to the plurality of respective thermoelectric coolers.

(E15) In the method of any of E1-E14, further comprising: generating a threshold indicator, which indicates the first temperature threshold, based at least in part on determining that the human or programmatic error occurs with regard to the setting of the target temperature.

(E16) In the method of any of E1-E15, further comprising: performing a thermal testing process with regard to each of the one or more semiconductor devices while an absolute value of a temperature of the respective semiconductor device is less than the temperature threshold; and discontinuing the performing of the thermal testing process with regard to each of the one or more semiconductor devices based at least in part on the absolute value of the temperature of the respective semiconductor device being greater than or equal to the temperature threshold.

(F1) An example method of setting one or more temperatures of one or more respective semiconductor devices (FIG. 1, 118, 128; FIG. 2, 218, 228, 238; FIG. 3, 318; FIG. 4, 418) in a thermal testing environment comprises controlling (FIG. 5, 502) a plurality of thermoelectric coolers (FIG. 1, 114, 124; FIG. 2, 214a-214b, 224a-224b, 234a-234b; FIG. 3, 314a-314b; FIG. 4, 414a-414b) independently using a plurality of respective variable voltage sources (FIG. 1, 130; FIG. 2, 230; FIG. 3, 330; FIG. 4, 430). The controlling comprises creating (FIG. 5, 510) a plurality of temperature differentials between first and second opposing surfaces of the plurality of respective thermoelectric coolers in accordance with a Peltier effect by applying a plurality of respective input voltages (FIG. 1, 110, 120; FIG. 3, 310, 320; FIG. 4, 410, 420) to the plurality of respective thermoelectric coolers. The method further comprises transferring (FIG. 5, 504), using each of one or more first heat exchangers (FIG. 1, 112, 122; FIG. 2, 212, 222, 232; FIG. 3, 312; FIG. 4, 412), heat between a fluid (FIG. 1, 152; FIG. 3, 352; FIG. 4, 452) and a respective subset of the thermoelectric coolers that is positioned between the respective first heat exchanger and a respective second heat exchanger of one or more second heat exchangers (FIG. 1, 116, 126; FIG. 2, 216, 226, 236; FIG. 3, 316; FIG. 4, 416). Each subset includes at least one of the plurality of thermoelectric coolers. The method further comprises transferring (FIG. 5, 506), using each of the one or more second heat exchangers, heat between the a respective semiconductor device of the one or more semiconductor devices and the respective subset of the thermoelectric coolers. The method further comprises detecting (FIG. 9, 902) a plurality of currents that are provided to the plurality of respective thermoelectric coolers. The method further comprises discontinuing (FIG. 9, 904) the applying of a designated input voltage of the plurality of input voltages to the respective thermoelectric cooler based at least in part on a magnitude of the current that is provided to the respective thermoelectric cooler being less than or equal to a current threshold.

(F2) In the method of F1, further comprising: detecting, using a temperature sensor, a temperature of a designated second heat exchanger of the one or more second heat exchangers; and delaying, using each variable voltage source in a designated subset of the variable voltage sources that controls a designated subset of the thermoelectric coolers associated with the designated second heat exchanger, providing the respective input voltage to the respective thermoelectric cooler until a manual reset of the respective variable voltage source is performed, based at least in part on the temperature of the designated second heat exchanger, as detected using the temperature sensor, having an absolute value that is greater than or equal to a temperature threshold.

(F3) In the method of any of F1-F2, further comprising: detecting, using a temperature sensor, a temperature of a circuit board to which a designated semiconductor device of the one or more semiconductor devices is attached; conditionally providing, using the thermal controller, power to the circuit board, the conditionally providing including not providing the power to the circuit board based at least in part on the temperature of the circuit board, as detected using the temperature sensor, having an absolute value that is greater than or equal to a temperature threshold.

(F4) In the method of any of F1-F3, further comprising: pumping, using a fluid pump, the fluid to the one or more first heat exchangers; detecting, using a temperature sensor, a temperature of a circuit board to which a designated semiconductor device of the one or more semiconductor devices is attached; and conditionally providing, using the thermal controller, power to the fluid pump, the conditionally providing including not providing the power to the fluid pump based at least in part on the temperature of the circuit board, as detected using the temperature sensor, having an absolute value that is greater than or equal to a temperature threshold.

(F5) In the method of any of F1-F4, further comprising: detecting, using a humidity sensor, a relative humidity in an environment of a designated semiconductor device of the one or more semiconductor devices; and discontinuing, using each variable voltage source associated with a designated subset of the thermoelectric coolers that is associated with the designated semiconductor device, providing the respective input voltage to the respective thermoelectric cooler in the designated subset based at least in part on the relative humidity, as detected using the humidity sensor, being greater than or equal to a humidity threshold.

(F6) In the method of any of F1-F5, further comprising: automatically resuming, using each variable voltage source associated with the designated subset of the thermoelectric coolers, providing the respective input voltage to the respective thermoelectric cooler in the designated subset based at least in part on the relative humidity, as detected using the humidity sensor, decreasing below the humidity threshold.

(F7) In the method of any of F1-F6, further comprising: detecting, using a flow sensor, a rate at which air flows in a chamber in which a designated semiconductor device of the one or more semiconductor devices is located; and discontinuing, using each variable voltage source associated with a designated subset of the thermoelectric coolers that is associated with the designated semiconductor device, providing the respective input voltage to the respective thermoelectric cooler in the designated subset based at least in part on the rate at which air flows in the chamber, as detected using the flow sensor, being greater than or equal to a rate threshold.

(F8) In the method of any of F1-F7, wherein the one or more semiconductor devices comprise at least a first semiconductor device and a second semiconductor device that are attached to a common circuit board; and wherein the method further comprises: simultaneously testing, using a processing system, at least the first semiconductor device and the second semiconductor device while a first subset of the plurality of variable voltage sources controls a first subset of the thermoelectric coolers, which is associated with the first semiconductor device, to have a first cumulative target temperature differential across the first subset of the thermoelectric coolers and a second subset of the plurality of variable voltage sources controls a second subset of the thermoelectric coolers, which is associated with the second semiconductor device, to have a second cumulative target temperature differential across the second subset of the thermoelectric coolers that is different from the first cumulative target temperature differential.

(F9) In the method of any of F1-F8, wherein controlling the plurality of thermoelectric coolers independently comprises: setting, using a designated subset of the plurality of variable voltage sources, a temperature in a chamber in which a designated semiconductor device of the one or more semiconductor devices is located to equal a target temperature by controlling a designated subset of the thermoelectric coolers that is associated with the designated semiconductor device.

(F10) In the method of any of F1-F9, further comprising: generating a voltage to control a circuit board to which a designated semiconductor device of the one or more semiconductor devices is attached; and not providing the voltage to the circuit board based at least in part on the magnitude of the current that is provided to the respective thermoelectric cooler being less than or equal to the current threshold.

(F11) In the method of any of F1-F10, further comprising: generating a first indicator or a second indicator depending on whether at least one current of the plurality of currents is modulated, including: generating the first indicator based on the at least one current being modulated, or generating the second indicator based on the at least one current being unmodulated.

(F12) In the method of any of F1-F11, further comprising: generating a plurality of indicators that indicate the respective magnitudes of the plurality of respective currents.

(F13) In the method of any of F1-F12, further comprising: generating an alarm regarding each current of the plurality of currents that has a magnitude that is less than or equal to the current threshold.

(F14) In the method of any of F1-F13, further comprising: selecting an alarm from a plurality of alarms that correspond to a plurality of respective magnitude ranges based at least in part on the magnitude of the current that is provided to the thermoelectric cooler to which application of the designated input voltage is discontinued being included in the magnitude range to which the selected alarm corresponds; and generating the alarm.

IV. Example Computer System

Figure 10:
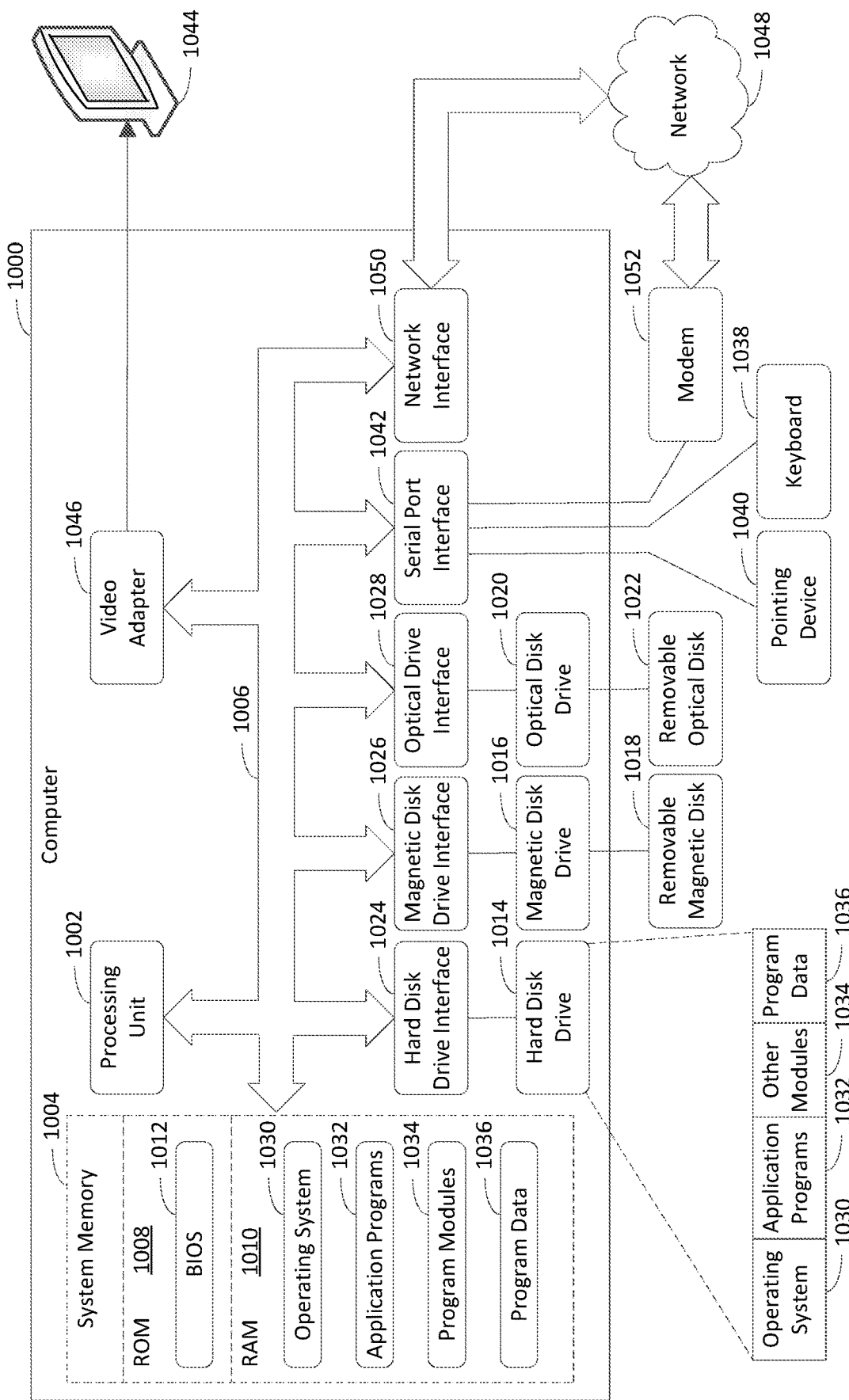
FIG. 10 depicts an example computer in which at least some aspects of embodiments may be implemented.

FIG. 10 depicts an example computer 1000 in which embodiments may be implemented. The processing system 250 shown in FIG. 2 and/or the processing system 450 shown in FIG. 4 may be implemented using computer 1000, including one or more features of computer 1000 and/or alternative features. Computer 1000 may be a general-purpose computing device in the form of a conventional personal computer, a mobile computer, or a workstation, for example, or computer 1000 may be a special purpose computing device. The description of computer 1000 provided herein is provided for purposes of illustration, and is not intended to be limiting. Embodiments may be implemented in further types of computer systems, as would be known to persons skilled in the relevant art(s).

As shown in FIG. 10, computer 1000 includes a processing unit 1002, a system memory 1004, and a bus 1006 that couples various system components including system memory 1004 to processing unit 1002. Bus 1006 represents one or more of any of several types of bus structures, including a memory bus or memory controller, a peripheral bus, an accelerated graphics port, and a processor or local bus using any of a variety of bus architectures. System memory 1004 includes read only memory (ROM) 1008 and random access memory (RAM) 1010. A basic input/output system 1012 (BIOS) is stored in ROM 1008.

Computer 1000 also has one or more of the following drives: a hard disk drive 1014 for reading from and writing to a hard disk, a magnetic disk drive 1016 for reading from or writing to a removable magnetic disk 1018, and an optical disk drive 1020 for reading from or writing to a removable optical disk 1022 such as a CD ROM, DVD ROM, or other optical media. Hard disk drive 1014, magnetic disk drive 1016, and optical disk drive 1020 are connected to bus 1006 by a hard disk drive interface 1024, a magnetic disk drive interface 1026, and an optical drive interface 1028, respectively. The drives and their associated computer-readable storage media provide nonvolatile storage of computer-readable instructions, data structures, program modules and other data for the computer. Although a hard disk, a removable magnetic disk and a removable optical disk are described, other types of computer-readable storage media can be used to store data, such as flash memory cards, digital video disks, random access memories (RAMs), read only memories (ROM), and the like.

A number of program modules may be stored on the hard disk, magnetic disk, optical disk, ROM, or RAM. These programs include an operating system 1030, one or more application programs 1032, other program modules 1034, and program data 1036. Application programs 1032 or program modules 1034 may include, for example, computer program logic for implementing any one or more of (e.g., at least a portion of) the components of each of the thermal testing systems 100, 200, 300, and/or 400, flowchart 500 (including any step of flowchart 500), flowchart 600 (including any step of flowchart 600), flowchart 700 (including any step of flowchart 700), flowchart 800 (including any step of flowchart 800), and/or flowchart 900 (including any step of flowchart 900), as described herein.

A user may enter commands and information into the computer 1000 through input devices such as keyboard 1038 and pointing device 1040. Other input devices (not shown) may include a microphone, joystick, game pad, satellite dish, scanner, touch screen, camera, accelerometer, gyroscope, or the like. These and other input devices are often connected to the processing unit 1002 through a serial port interface 1042 that is coupled to bus 1006, but may be connected by other interfaces, such as a parallel port, game port, or a universal serial bus (USB).

A display device 1044 (e.g., a monitor) is also connected to bus 1006 via an interface, such as a video adapter 1046. In addition to display device 1044, computer 1000 may include other peripheral output devices (not shown) such as speakers and printers.

Computer 1000 is connected to a network 1048 (e.g., the Internet) through a network interface or adapter 1050, a modem 1052, or other means for establishing communications over the network. Modem 1052, which may be internal or external, is connected to bus 1006 via serial port interface 1042.

As used herein, the terms "computer program medium" and "computer-readable storage medium" are used to generally refer to media (e.g., non-transitory media) such as the hard disk associated with hard disk drive 1014, removable magnetic disk 1018, removable optical disk 1022, as well as other media such as flash memory cards, digital video disks, random access memories (RAMs), read only memories (ROM), and the like. A computer-readable storage medium is not a signal, such as a carrier signal or a propagating signal. For instance, a computer-readable storage medium may not include a signal. Accordingly, a computer-readable storage medium does not constitute a signal per se. Such computer-readable storage media are distinguished from and non-overlapping with communication media (do not include communication media). Communication media embodies computer-readable instructions, data structures, program modules or other data in a modulated data signal such as a carrier wave. The term "modulated data signal" means a signal that has one or more of its characteristics set or changed in such a manner as to encode information in the signal. By way of example, and not limitation, communication media includes wireless media such as acoustic, RF, infrared and other wireless media, as well as wired media. Example embodiments are also directed to such communication media.

As noted above, computer programs and modules (including application programs 1032 and other program modules 1034) may be stored on the hard disk, magnetic disk, optical disk, ROM, or RAM. Such computer programs may also be received via network interface 1050 or serial port interface 1042. Such computer programs, when executed or loaded by an application, enable computer 1000 to implement features of embodiments discussed herein. Accordingly, such computer programs represent controllers of the computer 1000.

Example embodiments are also directed to computer program products comprising software (e.g., computer-readable instructions) stored on any computer-useable medium. Such software, when executed in one or more data processing devices, causes data processing device(s) to operate as described herein. Embodiments may employ any computer-useable or computer-readable medium, known now or in the future. Examples of computer-readable mediums include, but are not limited to storage devices such as RAM, hard drives, floppy disks, CD ROMs, DVD ROMs, zip disks, tapes, magnetic storage devices, optical storage devices, MEMS-based storage devices, nanotechnology-based storage devices, and the like.

It will be recognized that the disclosed technologies are not limited to any particular computer or type of hardware. Certain details of suitable computers and hardware are well known and need not be set forth in detail in this disclosure.

V. Conclusion

Although the subject matter has been described in language specific to structural features and/or acts, it is to be understood that the subject matter defined in the appended claims is not necessarily limited to the specific features or acts described above. Rather, the specific features and acts described above are disclosed as examples of implementing the claims, and other equivalent features and acts are intended to be within the scope of the claims.

What is claimed is:

1. A thermal testing system comprising:
a plurality of thermoelectric coolers, each thermoelectric cooler having first and second opposing surfaces, each thermoelectric cooler configured to have a temperature differential between the first and second opposing surfaces of a respective thermoelectric cooler, which is caused by a Peltier effect, based on a respective input voltage, each subset of a plurality of subsets of the plurality of thermoelectric coolers positioned between a respective first heat exchanger of one or more first heat exchangers and a respective second heat exchanger of one or more second heat exchangers, each subset including at least one of the plurality of thermoelectric coolers;
a thermal controller comprising a plurality of variable voltage sources that are configured to control the plurality of thermoelectric coolers independently, each variable voltage source configured to generate a respective input voltage that corresponds to a respective target temperature differential such that the respective input voltage causes the respective thermoelectric cooler to have the respective target temperature differential between the first and second opposing surfaces of the respective thermoelectric cooler;
the one or more first heat exchangers, each first heat exchanger configured to transfer heat between a respective subset of the plurality of thermoelectric coolers and a fluid; and
the one or more second heat exchangers, each second heat exchanger configured to transfer heat between a respective semiconductor device of one or more semiconductor devices and a respective subset of the plurality of thermoelectric coolers;
wherein each variable voltage source is configured to discontinue providing the respective input voltage to the respective thermoelectric cooler based at least in part on a determination that a fluid pump encounters a technical issue, wherein the fluid is received by the one or more first heat exchangers from the fluid pump.

2. The thermal testing system of claim 1, wherein the thermal controller is configured to generate a voltage to control a circuit board to which a designated semiconductor device of the one or more semiconductor devices is attached; and
wherein the thermal controller is further configured to not provide the voltage to the circuit board based at least in part on the determination that the fluid pump encounters the technical issue.

3. The thermal testing system of claim 1, further comprising:
a flow sensor configured to detect a rate of flow of the fluid that is received at the one or more first heat exchangers from the fluid pump;
wherein each variable voltage source is configured to discontinue providing the respective input voltage to the respective thermoelectric cooler based at least in part on the rate of flow of the fluid, as detected by the flow sensor, being less than or equal to a flow threshold; and
wherein the technical issue includes the rate of flow of the fluid being less than or equal to the flow threshold.

4. The thermal testing system of claim 1, further comprising:
a flow sensor configured to detect an amount of the fluid that is stored in the fluid pump;
wherein each variable voltage source is configured to discontinue providing the respective input voltage to the respective thermoelectric cooler based at least in part on the amount of the fluid that is stored in the fluid pump, as detected by the flow sensor, being less than or equal to an amount threshold; and
wherein the technical issue includes the amount of the fluid that is stored in the fluid pump being less than or equal to the amount threshold.

5. The thermal testing system of claim 1, further comprising:
a temperature sensor configured to detect a temperature of the fluid that is received at the one or more first heat exchangers from the fluid pump;
wherein each variable voltage source is configured to discontinue providing the respective input voltage to the respective thermoelectric cooler based at least in part on the temperature of the fluid, as detected by the temperature sensor, being greater than or equal to a temperature threshold; and
wherein the technical issue includes the temperature of the fluid being greater than or equal to the temperature threshold.

6. The thermal testing system of claim 1, further comprising:
a pressure sensor configured to detect a pressure between a designated second heat exchanger of the one or more second heat exchangers and a designated semiconductor device of the one or more semiconductor devices;
wherein each variable voltage source that is configured to control a particular thermoelectric cooler in the subset of the plurality of thermoelectric coolers that is positioned between a designated first heat exchanger of the one or more first heat exchangers and the designated second heat exchanger is configured to discontinue providing the respective input voltage to the particular thermoelectric cooler based at least in part on the pressure between the designated second heat exchanger and the designated semiconductor device, as detected by the pressure sensor, being less than or equal to a pressure threshold.

7. A thermal testing system comprising:

a plurality of thermoelectric coolers, each thermoelectric cooler having first and second opposing surfaces, each thermoelectric cooler configured to have a temperature differential between the first and second opposing surfaces of a respective thermoelectric cooler, which is caused by a Peltier effect, based on a respective input voltage, each subset of a plurality of subsets of the plurality of thermoelectric coolers positioned between a respective first heat exchanger of one or more first heat exchangers and a respective second heat exchanger of one or more second heat exchangers, each subset including at least one of the plurality of thermoelectric coolers;

a thermal controller comprising a plurality of variable voltage sources that are configured to control the plurality of thermoelectric coolers independently, each variable voltage source configured to generate a respective input voltage that corresponds to a respective target temperature differential such that the respective input voltage causes the respective thermoelectric cooler to have the respective target temperature differential between the first and second opposing surfaces of the respective thermoelectric cooler;

the one or more first heat exchangers, each first heat exchanger configured to transfer heat between a respective subset of the plurality of thermoelectric coolers and a fluid;

the one or more second heat exchangers, each second heat exchanger configured to transfer heat between a respective semiconductor device of one or more semiconductor devices and a subset of the plurality of thermoelectric coolers; and a processing system configured to identify a target temperature of a designated semiconductor device of the one or more semiconductor devices by reviewing a temperature indicator that indicates the target temperature, which is manually set by a user of the thermal testing system or which is programmatically set by software;

wherein the processing system is further configured to determine whether a human or programmatic error occurs with regard to setting of the target temperature based at least in part on whether an absolute value of the target temperature is greater than or equal to a first temperature threshold; and wherein the processing system is further configured to cause each variable voltage source of the plurality of variable voltage sources to not provide the respective input voltage to the respective thermoelectric cooler based at least in part on a determination that the human or programmatic error occurs with regard to the setting of the target temperature as a result of the absolute value of the target temperature being greater than or equal to the first temperature threshold.

8. The thermal testing system of claim 7, wherein the thermal controller is configured to generate a voltage to control a circuit board to which the designated semiconductor device is attached; and wherein the thermal controller is further configured to not provide the voltage to the circuit board based at least in part on the determination that the human or programmatic error occurs with regard to the setting of the target temperature as a result of the absolute value of the target temperature being greater than or equal to the first temperature threshold.

9. The thermal testing system of claim 8, wherein the thermal controller is configured to not provide the voltage to the circuit board further based at least in part on the absolute value of the target temperature being greater than or equal to a second temperature threshold that is greater than the first temperature threshold.

10. The thermal testing system of claim 9, wherein the thermal controller is configured to generate a voltage to control a fluid pump from which the fluid is received by the one or more first heat exchangers; and wherein the thermal controller is further configured to not provide the voltage to the fluid pump based at least in part on the determination that the human or programmatic error occurs with regard to the setting of the target temperature as a result of the absolute value of the target temperature being greater than or equal to the first temperature threshold and further based at least in part on the absolute value of the target temperature being greater than or equal to a third temperature threshold that is greater than the second temperature threshold.

11. The thermal testing system of claim 7, further comprising:

an interface configured to generate an indicator, which indicates that the human or programmatic error has occurred with regard to the setting of the target temperature, based at least in part on the determination that the human or programmatic error occurs with regard to the setting of the target temperature.

12. The thermal testing system of claim 11, wherein the indicator further indicates that the plurality of variable voltage sources is to be reset manually to enable the plurality of variable voltage sources to provide the respective input voltages to the plurality of thermoelectric coolers.

13. The thermal testing system of claim 11, wherein the interface is further configured to generate a threshold indicator, which indicates the first temperature threshold, based at least in part on the determination that the human or programmatic error occurs with regard to the setting of the target temperature.

14. The thermal testing system of claim 7, wherein the processing system is further configured to perform a thermal testing process with regard to each of the one or more semiconductor devices while an absolute value of a temperature of the respective semiconductor device is less than the temperature threshold; and wherein the processing system is further configured to discontinue performance of the thermal testing process with regard to each of the one or more semiconductor devices based at least in part on the absolute value of the temperature of the respective semiconductor device being greater than or equal to the temperature threshold.

15. A thermal testing system comprising:

a plurality of thermoelectric coolers, each thermoelectric cooler having first and second opposing surfaces, each thermoelectric cooler configured to have a temperature differential between the first and second opposing surfaces of a respective thermoelectric cooler, which is caused by a Peltier effect, based on a respective input voltage, each subset of a plurality of subsets of the plurality of thermoelectric coolers positioned between a respective first heat exchanger of one or more first heat exchangers and a respective second heat exchanger of one or more second heat exchangers, each subset including at least one of the plurality of thermoelectric coolers;

a thermal controller comprising a plurality of variable voltage sources that are configured to control the plurality of thermoelectric coolers independently, each variable voltage source configured to generate a respective input voltage that corresponds to a respective target temperature differential such that the respective input voltage causes the respective thermoelectric cooler to have the respective target temperature differential between the first and second opposing surfaces of the respective thermoelectric cooler;

the one or more first heat exchangers, each first heat exchanger configured to transfer heat between a respective subset of the plurality of thermoelectric coolers and a fluid;

the one or more second heat exchangers, each second heat exchanger configured to transfer heat between a respective semiconductor device of one or more semiconductor devices and a respective subset of the plurality of thermoelectric coolers; and a current sensor configured to detect a plurality of currents that are provided to the plurality of thermoelectric coolers;

wherein each variable voltage source is configured to discontinue providing the respective input voltage to the respective thermoelectric cooler based at least in part on a magnitude of the current that is provided to the respective thermoelectric cooler, as detected by the current sensor, being less than or equal to a current threshold.

16. The thermal testing system of claim 15, wherein the thermal controller is configured to generate a voltage to control a circuit board to which a designated semiconductor device of the one or more semiconductor devices is attached; and wherein the thermal controller is further configured to not provide the voltage to the circuit board based at least in part on the magnitude of the current that is provided to the respective thermoelectric cooler, as detected by the current sensor, being less than or equal to the current threshold.

17. The thermal testing system of claim 15, further comprising:

an interface configured to generate a first indicator or a second indicator depending on whether at least one current of the plurality of currents is modulated,
the interface configured to generate the first indicator based on the at least one current being modulated,
the interface configured to generate the second indicator based on the at least one current being unmodulated.

18. The thermal testing system of claim 15, further comprising:

an interface configured to generate a plurality of indicators that indicate the respective magnitudes of the plurality of respective currents.

19. The thermal testing system of claim 15, further comprising:

an interface configured to generate an alarm regarding each current of the plurality of currents that has a magnitude, as detected by the current sensor, that is less than or equal to the current threshold.

20. The thermal testing system of claim 15, further comprising:

an interface configured to generate a plurality of alarms related to a plurality of respective current thresholds, the interface configured to generate each alarm of the plurality of alarms based at least in part on a magnitude of a current of the plurality of currents, as detected by the current sensor, being less than or equal to a respective current threshold of the plurality of current thresholds.

* * * * *